US012782784B2

(12) United States Patent
Ina et al.

(10) Patent No.: US 12,782,784 B2

(45) Date of Patent: Nov. 3, 2026

(54) DISPLAY DEVICE

(71) Applicant: Sharp Display Technology Corporation, Kameyama City (JP)

(72) Inventors: Keiichi Ina, Kameyama City (JP); Takashi Satoh, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 166 days.

(21) Appl. No.: 18/935,465

(22) Filed: Nov. 2, 2024

(65) Prior Publication Data

US 2025/0180954 A1 Jun. 5, 2025

(30) Foreign Application Priority Data

Nov. 30, 2023 (JP) ................................ 2023-202759

(51) Int. Cl.

*G02F 1/1362* (2006.01)
*G02F 1/1368* (2006.01)
*H10D 86/40* (2025.01)
*H10D 86/60* (2025.01)

(52) U.S. Cl.

CPC ...... *G02F 1/136286* (2013.01); *G02F 1/1368* (2013.01); *H10D 86/451* (2025.01); *H10D 86/60* (2025.01); *H10D 86/441* (2025.01)

(58) Field of Classification Search

CPC . G02F 1/136486; G02F 1/1368; H10D 86/60; H10D 86/451; H10D 86/441

See application file for complete search history.

(56) References Cited

U.S. PATENT DOCUMENTS

2009/0128757 A1 5/2009 Koshihara
2019/0324580 A1* 10/2019 Tanaka .................... G06F 3/041
2020/0064665 A1* 2/2020 Ishikawa ........... G02F 1/133711
2023/0317737 A1* 10/2023 Ishikawa .............. H10D 86/441
257/59

FOREIGN PATENT DOCUMENTS

JP 2000-105370 A 4/2000
JP 2009-122569 A 6/2009

* cited by examiner

*Primary Examiner* — Anne M Hines

(74) *Attorney, Agent, or Firm* — ScienBiziP, P.C.

(57) ABSTRACT

A display device includes a switching component, a first electrode connected to the switching component, a first line connected to the switching component and included in a lower layer than the first electrode, a second electrode included in an upper layer than the first line and including a reflection layer that reflects light and has an uneven surface, a third electrode included in a layer lower than the first electrode and upper than the first line and disposed to overlap at least the first electrode and the first line and having a common potential, a first insulating film disposed between the first electrode and the third electrode, and a second insulating film included in a layer upper than the first line and lower than the third electrode and having a thickness greater than a thickness of the first insulating film.

9 Claims, 19 Drawing Sheets

DISPLAY DEVICE

CROSS REFERENCE TO RELATED APPLICATION

This application claims priority from Japanese Patent Application No. 2023-202759 filed on Nov. 30, 2023. The entire contents of the priority application are incorporated herein by reference.

TECHNICAL FIELD

The present technology described herein relates to a display device.

BACKGROUND

A reflection type liquid crystal display component has been known as a display device. The reflection type liquid crystal display component includes a reflection plate, an opposed substrate that is opposite the reflection plate, and a liquid crystal layer that is disposed between the reflection plate and the opposed substrate. The reflection plate is disposed on a glass substrate and includes a photosensitive resin layer and a reflection film disposed on the photosensitive resin layer. The photosensitive resin layer has an uneven surface that includes recessed portions inclined in a certain direction.

In such a reflection type liquid crystal display component, the reflection film having the uneven surface functions as a pixel electrode; however, such a reflection type liquid crystal display component may not include a configuration for keeping a potential of the reflection film that is charged according to the driving of a TFT. To keep the potential of the reflection film, for example, a common electrode may be disposed to overlap the reflection film via an insulation film and create a storage capacitance between the reflection film and the common electrode. However, in the configuration of the reflection type liquid crystal display component, with the common electrode being disposed to overlap the reflection film having the uneven surface via the insulation film, the common electrode also has an uneven shape similar to the reflection film. Therefore, the common electrode and the reflection film may be unlikely to keep a constant distance over an entire area therebetween. With the distance between the common electrode and the reflection film being varied, the storage capacitance may be unstable and display quality may be lowered.

SUMMARY

The technology described herein was made in view of the above circumstances. An object is to suppress lowering of display quality.

(1) A display device according to the technology described herein includes a switching component, a first electrode connected to the switching component, a first line being for transmitting an image signal to be supplied to the first electrode and connected to the switching component and included in a layer lower than a layer including the first electrode, a second electrode included in a layer upper than the layer including the first line, the second electrode including a reflection layer that reflects light and has an uneven surface, a third electrode included in a layer lower than the layer including the first electrode and upper than the layer including the first line, the third electrode being disposed to overlap at least the first electrode and the first line and having a common potential, a first insulating film disposed between the first electrode and the third electrode, and a second insulating film included in a layer upper than the layer including the first line and lower than the layer including the third electrode, the second insulating film having a thickness greater than a thickness of the first insulating film.

(2) The display device may further include, in addition to (1), a third insulating film disposed between the second electrode and the first electrode and having a thickness greater than the thickness of the first insulating film, and the second electrode may be included in a layer upper than the layer including the first electrode.

(3) The display device may further include, in addition to (2), a fourth electrode disposed opposite and away from the second electrode and having the common potential and a liquid crystal layer disposed between the second electrode and the fourth electrode and disposed to overlap the first electrode. The third insulating film may include a first contact hole in a portion overlapping the second electrode and the first electrode, and the second electrode may be connected to the first electrode via the first contact hole.

(4) The display device may further include, in addition to (1), a fourth insulating film included in a layer upper than the layer including the first line and lower than the layer including the second electrode and having a thickness greater than the thickness of the first insulating film and the second electrode may be included in a layer lower than the layer including the second insulating film.

(5) In the display device, in addition to (4), the second electrode may have the common potential.

(6) In the display device, in addition to (5), the first electrode may include first electrodes that are arranged at intervals, and the second electrode may be disposed in an area extending over the first electrodes.

(7) The display device may further include, in addition to any one of (4) to (6), a fifth electrode included in a layer lower than the layer including the second insulating film and upper than the layer including the fourth insulating film. The second electrode may be a portion of a transparent electrode film that is included in a layer lower than the layer including the reflection layer. The fifth electrode may be a portion of the transparent electrode film and disposed to overlap a portion of the switching component and a portion of the first electrode. The fourth insulating film may include a second contact hole in a portion overlapping the switching component and the fifth electrode and the fifth electrode may be connected to the switching component via the second contact hole. The second insulating film includes a third contact hole in a portion overlapping the first electrode and the fifth electrode and the first electrode may be connected to the fifth electrode via the third contact hole.

(8) The display device may further include, in addition to (7), a sixth electrode disposed opposite and away from the first electrode and having the common potential, and a liquid crystal layer disposed between the first electrode and the sixth electrode.

(9) The display device may further include, in addition to any one of (1) to (8), a second line being for transmitting scan signals and connected to the switching component and crossing the first line, a fifth insulating film included in a layer lower than the layer including the first line and upper than the layer including the second line, and a third line included in a layer lower than the layer including the fifth insulating film and disposed to overlap the first line. The fifth insulating film may include a fourth contact hole in a portion overlapping the first line and the third line. The first line may be connected to the third line via the fourth contact hole.

According to the technology described herein, lowering of display quality can be suppressed.

DETAILED DESCRIPTION

First Embodiment

Figure 1:
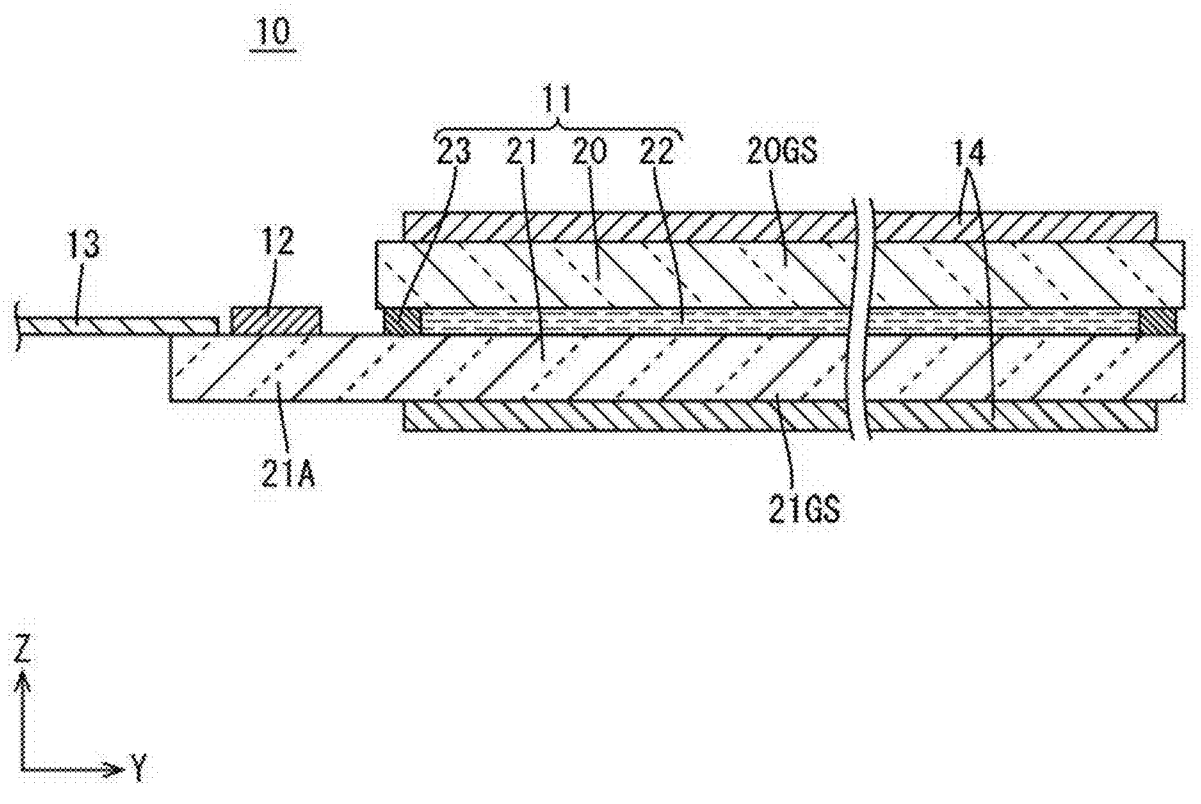
FIG. 1 is a cross-sectional view schematically illustrating a liquid crystal panel, a driver, and a flexible substrate included in a liquid crystal display device according to a first embodiment.

A first embodiment will be described with reference to FIGS. 1 to 11. In this embodiment section, a semi-transmissive type liquid crystal display device 10 will be described. X-axes, Y-axes, and Z-axes may be present in the drawings. The axes in each drawing correspond to the respective axes in other drawings. An upper side and a lower side in FIGS. 1, 4, 5, 8, and 11 correspond to a front side and a back side of the liquid crystal display device 10, respectively.

As illustrated in FIG. 1, the semi-transmissive type liquid crystal display device 10 includes a semi-transmissive type liquid crystal panel 11 (a display device) that displays an image and a backlight unit (a lighting device) that supplies light to the liquid crystal panel 11. The semi-transmissive liquid crystal panel 11 can perform reflection displaying and transmissive displaying. The liquid crystal panel 11 reflects external light (surrounding light, environment light) and the reflected light is used for the reflection displaying. The light from the backlight unit (light from backlight) that passes through the liquid crystal panel 11 is used for the transmissive displaying. Examples of the external light used for the reflection displaying include sunlight and light from interior light. A middle section of a screen of the liquid crystal panel 11 is configured as a display area AA in which images are displayed. An outer section in a frame shape surrounding the display area AA in the screen of the liquid crystal panel 11 is configured as a non-display area NAA in which the images are not displayed. The backlight unit is disposed behind (on a lower side in FIG. 1) the liquid crystal panel 11. The backlight unit includes light sources configured to emit white light (e.g., LEDs) and optical members for converting the light from the light sources into planar light by applying optical effects to the light from the light sources.

As illustrated in FIG. 1, the liquid crystal panel 11 includes a pair of substrates 20, 21 that are bonded to each other. One of the substrates 20, 21 on the front side (a front surface side) is an opposed substrate 20 (a second substrate, a CF substrate) and another one on the back side (a back surface side) is an array substrate 21 (a first substrate). The opposed substrate 20 and the array substrate 21 include glass substrates 20GS, 21GS (a substrate) and various kinds of films are formed in layers on an inner surface side the glass substrates 20GS, 21GS. The glass substrates 20GS, 21GS are made of glass material and alkali-free glass is used as the glass material, for example. A predetermined gap is between the substrates 20, 21 and a liquid crystal layer 22 is between the substrates 20 and 21. The liquid crystal layer 22 includes liquid crystal molecules having optical characteristics that vary according to application of an electric field. A sealing portion 23 is disposed between the outer peripheral portions of the substrates 20, 21 for sealing the liquid crystal layer 22. The sealing portion 23 is made of photosetting resin or thermosetting resin. The sealing portion 23 is formed in a frame shape (an endless loop shape) and surrounds the liquid crystal layer 22. Polarizing plates 14 are attached to outer surfaces of the substrates 20 and 21.

As illustrated in FIG. 1, the opposed substrate 20 has a Y-axis dimension that is smaller than a Y-axis dimension of the array substrate 21. The opposed substrate 20 is bonded to the array substrate 21 such that one of side edges of the opposed substrate 20 extending in the X-axis direction is aligned with a corresponding one of the side edges of the array substrate 21. Therefore, a side edge section including another one of the side edges of the array substrate 21 extending in the X-axis direction projects from another one of the side edges of the opposed substrate 20 and a projecting side edge section is an uncovered section 21A. A driver 12 (a signal supply section) that is a component for supplying various signals related to a display function and a flexible substrate 13 are mounted on the uncovered section 21A.

The driver 12 is an LSI chip including a driver circuit therein. As illustrated in FIG. 1, the driver 12 is mounted on the uncovered section 21A of the array substrate 21 through the chip-on-glass (COG) technology. The driver 12 processes the various kinds of signals transmitted via the flexible substrate 13. The flexible substrate 13 includes a substrate made of synthetic resin (e.g., polyimide-based resin substrate) having insulating properties and flexibility and multiple traces formed on the substrate. A first end of the flexible substrate 13 is connected to the uncovered section 21A of the array substrate 21 and a second end of the flexible substrate 13 is connected to an external circuit board (a control board). The driver 12 and the flexible substrate 13 are components for supplying various kinds of signals (for example, scan signals, image signals) to a backplane circuit (gate lines 26, source lines 27).

Figure 2:
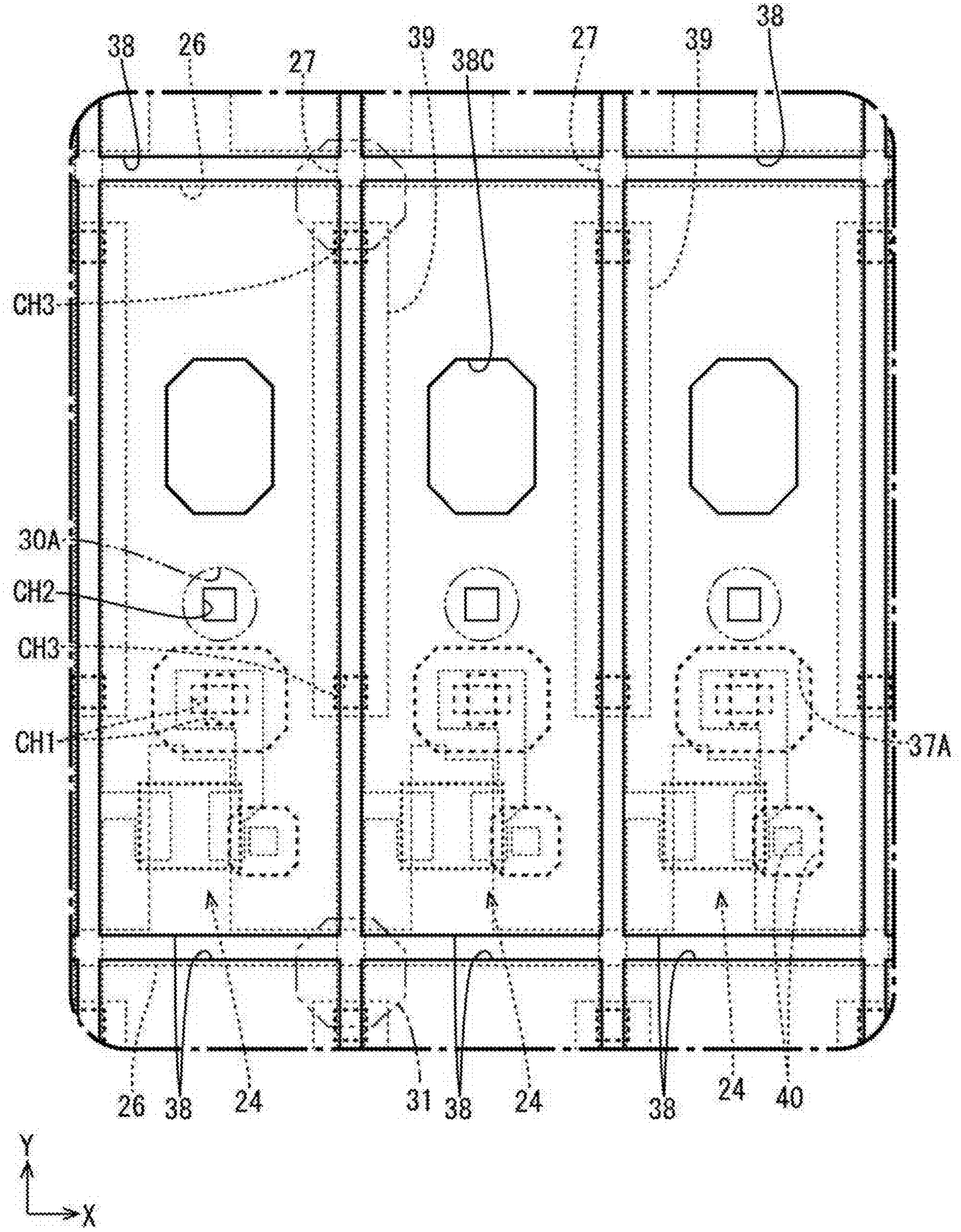
FIG. 2 is a plan view illustrating a pixel arrangement in a display area of the liquid crystal panel according to the first embodiment.
Figure 3:
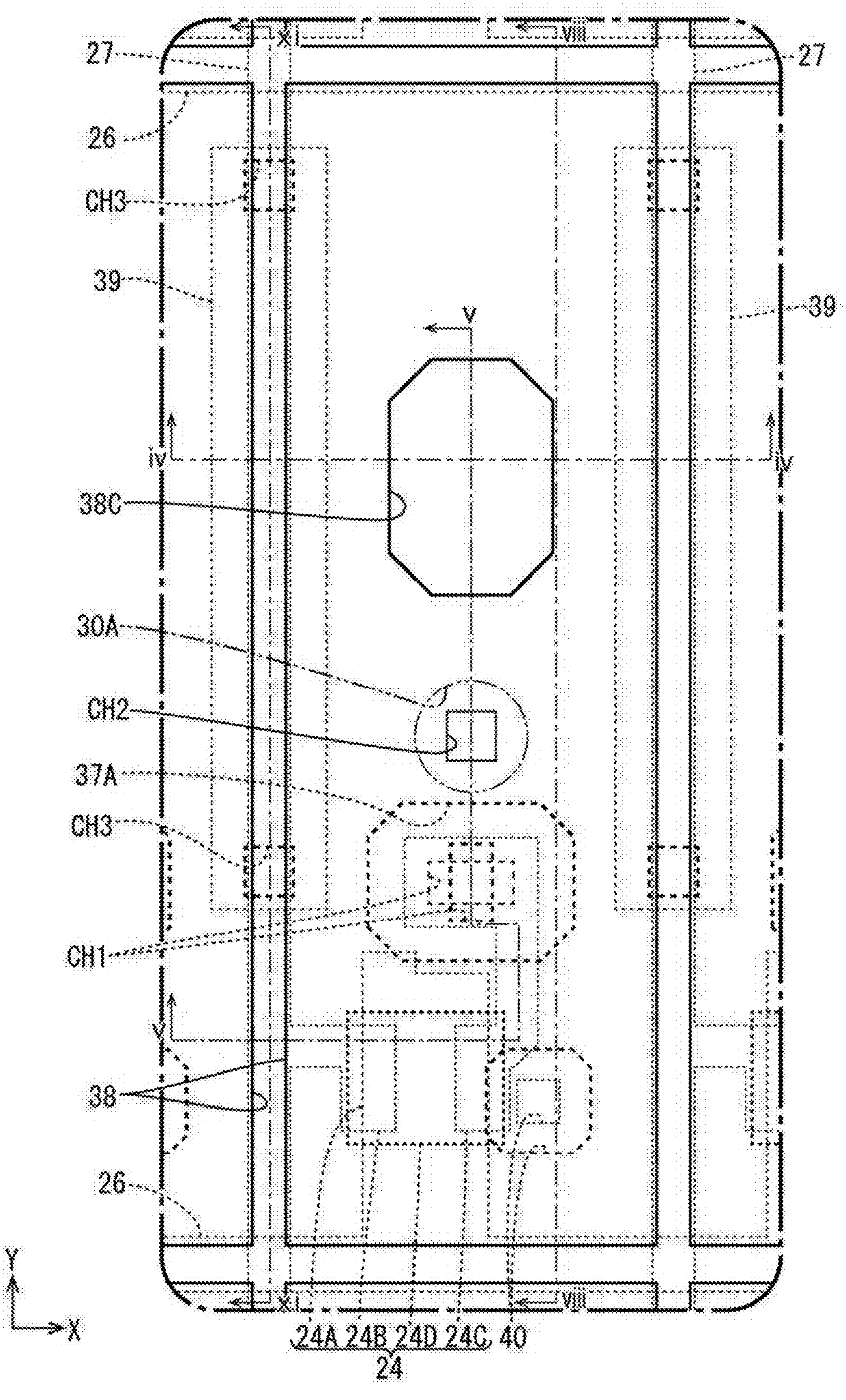
FIG. 3 is an enlarged plan view illustrating the pixel arrangement in the display area of the liquid crystal panel according to the first embodiment.

A configuration of the array substrate 21 in the display area AA will be described with reference to FIGS. 2 and 3. As illustrated in FIGS. 2 and 3, thin film transistors (TFTs) 24 (switching components) and pixel electrodes 25 (first electrodes) are at least arranged in an area of an inner surface of the array substrate 21 in the display area AA. The TFTs 24 and the pixel electrodes 25 are arranged at intervals in a matrix (rows and columns) along the X-axis direction and the Y-axis direction. Gate lines 26 (second lines, scanning lines) and source lines 27 (first lines, image lines, signal lines) are routed perpendicular to each other (with crossing) to surround the TFTs 24 and the pixel electrodes 25. The gate lines 26 extend along the X-axis direction and are arranged at intervals with respect to the Y-axis direction. The gate lines 26 are for transmitting scan signals for driving the TFTs 24. The source lines 27 extend along the Y-axis direction and are arranged at intervals with respect to the X-axis direction. The source lines 27 are for transmitting image signals for charging the pixel electrode 25. The pixel electrode 25 and a corresponding color filter 28 are configured as a pixel, which is a display unit. The TFTs 24, the gate lines 26, and the source lines 27 are configured as a backplane circuit for driving pixels.

Figure 4:
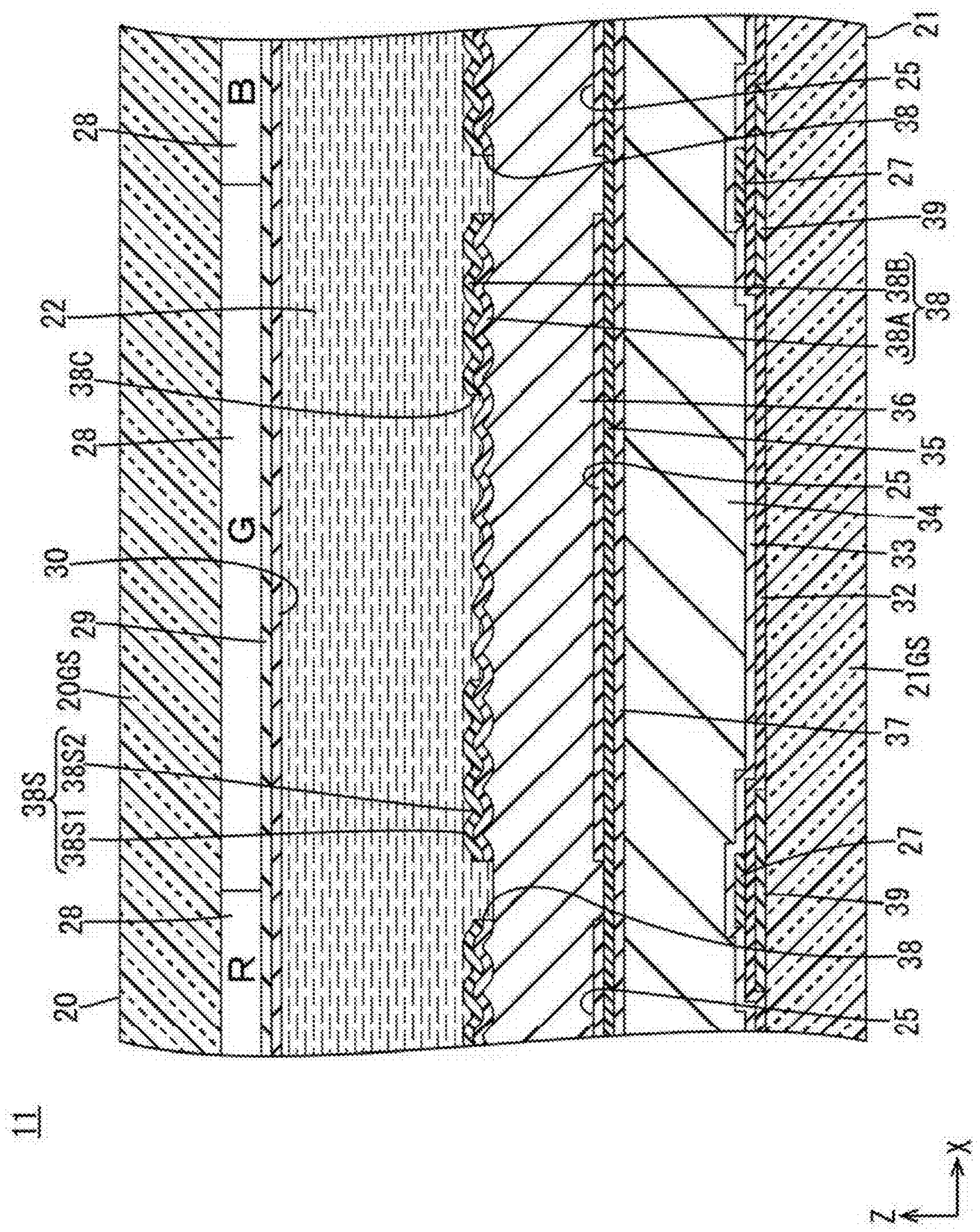
FIG. 4 is a cross-sectional view of the liquid crystal panel according to the first embodiment taken along line iv-iv in FIG. 3.

A configuration of the opposed substrate 20 in the display area will be described with reference to FIG. 4. As illustrated in FIG. 4, color filters 28 that exhibit three different colors of blue (B), green (G), and red (R) are disposed in the display area AA on the inner surface side of the opposed substrate 20. The color filters 28 that exhibit different colors are arranged adjacent to each other in the X-axis direction. The color filters 28 that exhibit different colors extend along the Y-axis direction. Namely, the color filters 28 that exhibit different colors are arranged in a stripe as a whole. The color filters 28 are arranged to overlap the pixel electrodes 25 of the array substrate 21, respectively, in a plan view. The color filter 28 and the corresponding pixel electrode 25 that are overlapped each other are configured as a pixel, which is a display unit. The color filters 28 that exhibit different colors are arranged such that a boundary therebetween (a color boundary) overlaps the source line 27. On an upper layer side (the liquid crystal layer 22 side) of the color filter 28, an overcoat film 29 is disposed in a solid manner on a substantially entire area of the opposed substrate 20 for planarization.

As illustrated in FIG. 4, an opposed electrode 30 (a fourth electrode) is disposed in a layer upper than the layer including the overcoat film 29. The opposed electrode 30 is formed in a solid manner similar to the overcoat film 29 and spreads over an entire area of at least the display area. The opposed electrode 30 is made of transparent electrode material. The opposed electrode 30 is supplied with a common potential. Therefore, an electric field is created between the opposed electrode 30 and the pixel electrode 25 that is charged by the TFT 24. With the electric field, orientations of the liquid crystal molecules included in the liquid crystal layer 22 can be controlled. The liquid crystal panel 11 operates in the vertical alignment (VA) mode. In the VA mode, the liquid crystal molecules are oriented vertically with respect to the surface of the glass substrate and the orientations of the liquid crystal molecules are controlled with the vertical electric filed. A spacer 31 is disposed on an upper layer side of the opposed electrode 30 (refer to FIG. 2). The spacer 31 projects toward the array substrate 21. A projecting end surface of the spacer 31 can be contacted with the inner surface of the array substrate 21 and this keeps a distance between the substrates 20, 21 that is a cell gap (a thickness of the liquid crystal layer 22). Alignment films for orienting the liquid crystal molecules in the liquid crystal layer 22 are formed on innermost surfaces (in an uppermost layer) of the substrates 20 and 21 in contact with the liquid crystal layer 22.

Figure 5:
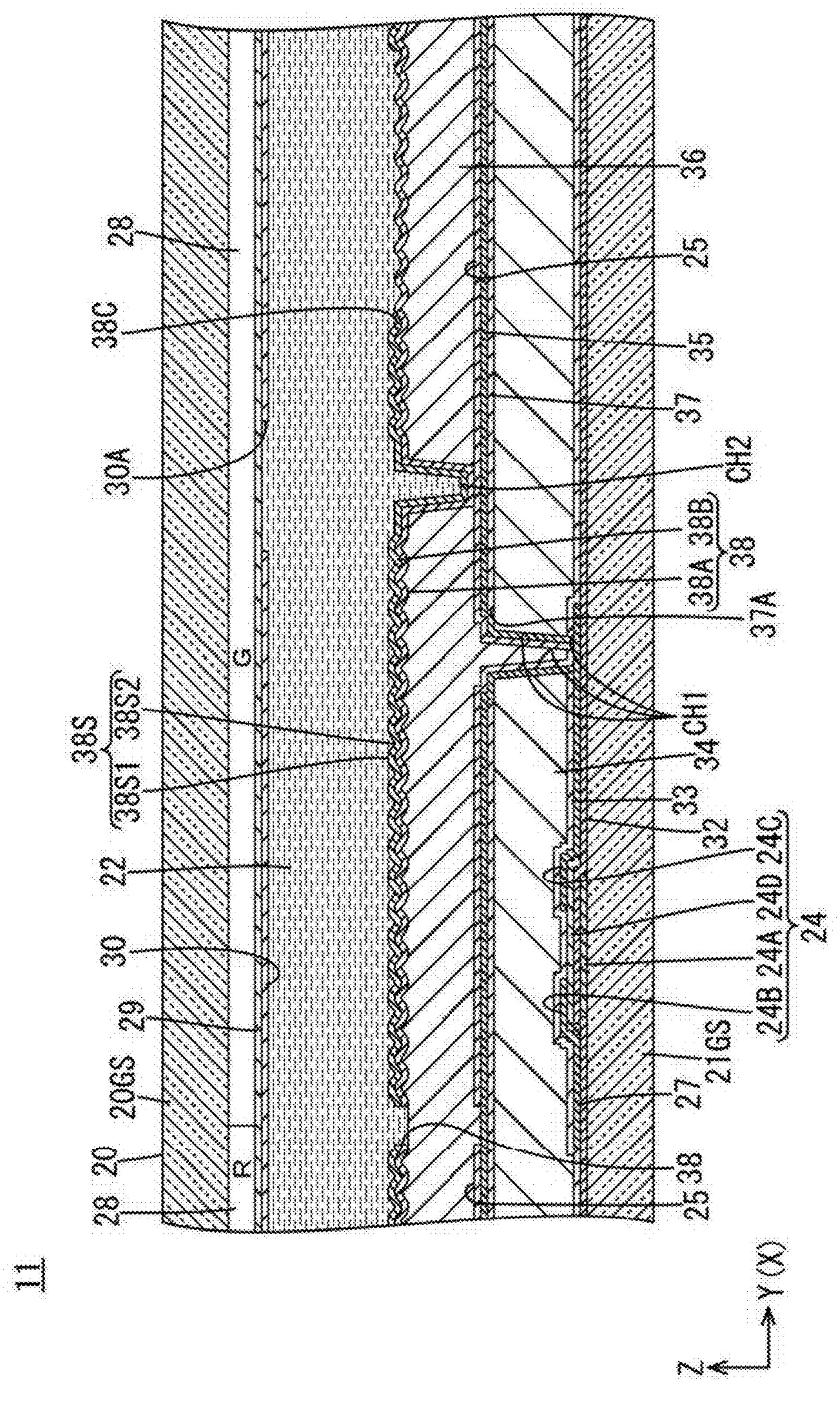
FIG. 5 is a cross-sectional view of the liquid crystal panel according to the first embodiment taken along line v-v in FIG. 3.

Films disposed on top of each other on the inner surface side of the array substrate 21 will be described with reference to FIGS. 4 and 5. As illustrated in FIGS. 4 and 5, on the glass substrate 21GS of the array substrate 21, a first metal film (a first conductive film), a gate insulating film 32 (a fifth insulation film), a semiconductor film, a second metal film (a second conductive film), an interlayer insulating film 33, a first planarization film 34 (a second insulating film, a first organic insulating film), a first transparent electrode film (a third conductive film), an inter-electrode insulating film 35 (a first insulating film), a second transparent electrode film (a fourth conductive film), a second planarization film 36 (a third insulating film, a second organic insulating film), a third transparent electrode film (a fifth conductive film), a third metal film (a sixth conductive film), and an alignment film are disposed on top of each other in this sequence from a lower layer side (from the glass substrate 21GS side).

The first metal film, the second metal film, and the third metal film may be a single-layer film made of one kind of metal, a multilayer film made of a material containing different kinds of metals, or an alloy. Examples of the metals include copper, titanium, aluminum, molybdenum, and tungsten. With such a configuration, the first metal film, the second metal film, and the third metal film have electrically conductive properties, light reflecting properties, and light blocking properties. Portions of the first metal film are configured as the gate lines 26 and gate electrodes 24A of the TFTs 24. Portions of the second metal film are configured as the source lines 27, source electrodes 24B and drain electrodes 24C of the TFTs 24. A portion of the third metal film is configured as a reflection electrode 38. The semiconductor film is a thin film made of semiconductor material such as oxide semiconductor material and portions of the semiconductor film are configured as semiconductor sections 24D of the TFTs 24. The first transparent electrode film, the second transparent electrode film, and the third transparent film are made of a transparent electrode material (e.g., indium tin oxide (ITO) and indium zinc oxide (IZO)). A portion of the first transparent electrode film is configured as a common electrode 37. Portions of the second transparent electrode film are configured as the pixel electrodes 25. A portion of the third transparent electrode film is configured as a portion of a reflection electrode 38.

The gate insulating film 32, the interlayer insulating film 33, and the inter-electrode insulating film 35 are made of an inorganic insulating material such as silicon nitride ($SiN_X$) and silicon oxide ($SiO_2$). The first planarization film 34 and the second planarization film 36 are made of an organic insulating material such as PMMA (acrylic resin). The first planarization film 34 and the second planarization film 36 are thicker than the gate insulating film 32, the interlayer insulating film 33, and the inter-electrode insulating film 35, which are made of inorganic insulating material. The thickness of the first planarization film 34 and the second planarization film 36 is from about 1 μm to 3 μm. The first planarization film 34 planarizes a structure (the common electrode 37) formed from the first transparent electrode film that is disposed on the upper layer side of the first planarization film 34. With the second planarization film 36, a structure (the reflection electrode 38) formed from the first transparent electrode film that is disposed on the upper layer side of the second planarization film 36 can have any cross-sectional shape. The gate insulating film 32 insulates the first metal film in the lower layer from the semiconductor film and the second metal film in the upper layer. The interlayer insulating film 33 and the first planarization film insulate the semiconductor film and the second metal in the lower layer from the first transparent electrode film in the upper layer. The inter-electrode insulating film 35 insulates the first transparent electrode film in the lower layer from the second transparent electrode film in the upper layer. The second planarization film 36 insulates the second transparent electrode film in the lower layer from the third transparent electrode film in the upper layer.

Figure 6:
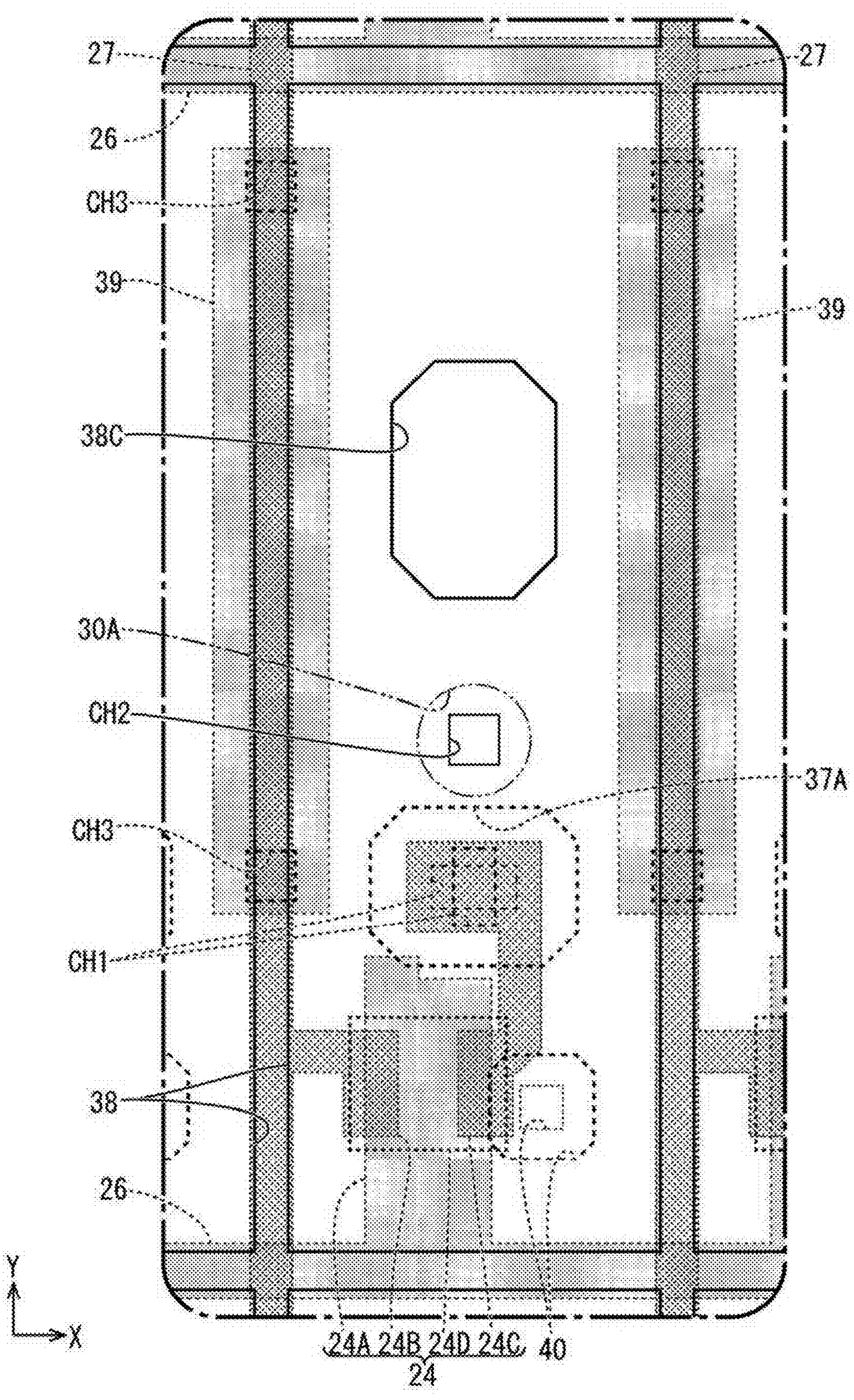
FIG. 6 is an enlarged plan view illustrating the pixel arrangement in the display area of the liquid crystal panel according to the first embodiment and illustrating a first metal film and a second metal film with different kinds of shadings.

A configuration of the TFT 24 will be described in detail with reference to FIGS. 5 and 6. FIG. 6 illustrates a pixel arrangement of the portion in FIG. 3 and the first metal film and the second metal film included in the array substrate 21 are illustrated with different types of shadings in FIG. 6. As illustrated in FIGS. 5 and 6, the TFT 24 includes the gate electrode 24A that is a portion of the first metal film. The gate electrode 24A extends from the gate line 26. Specifically, the gate electrode 24A is a portion of the gate line 26 that extends in the Y-axis direction toward the pixel electrode 25 to be connected. The gate electrode 24A has a substantially vertically long rectangular plan view shape. The gate electrode 24A is supplied with scan signals transmitted via the gate line 26. The TFT 24 includes the source electrode 24B that is a portion of the second metal film. The source electrode 24B extends from the source line 27. Specifically, the source electrode 24B is a portion of the source line 27 that extends in the X-axis direction toward the pixel electrode 25 to be connected and is bent toward the gate line 26 and extends in the Y-axis direction. The source electrode 24B has a substantially L-shape in a plan view. An extending end portion (a right portion in FIG. 6) of the source electrode 24B that extends from the source line 27 is connected to the semiconductor section 24D and overlaps the gate electrode 24A.

As illustrated in FIGS. 5 and 6, the TFT 24 includes the drain electrode 24C that is a portion of the second metal film. The drain electrode 24C has an island shape that extends in a direction along the Y-axis direction as a whole. A first end portion (a lower end in FIG. 6) of the drain electrode 24C is connected to the semiconductor section 24D and overlaps the gate electrode 24A. The first end portion of the drain electrode 24C is away from the source electrode 24B with respect to the X-axis direction. A second end portion (an upper end in FIG. 6) of the drain electrode 24C has a laterally long rectangular shape and is connected to the pixel electrode 25. An entire area of the drain electrode 24C overlaps the pixel electrode 25. Each of the interlayer insulating film 33 and the first planarization film 34 has a pixel contact hole CH1 in a portion overlapping the second end portion of the drain electrode 24C and a portion of the pixel electrode 25. The pixel electrode 25 is connected to the drain electrode 24C via the pixel contact hole CH1.

As illustrated in FIGS. 5 and 6, the TFT 24 includes the semiconductor section 24D that is a portion of the semiconductor film. The semiconductor section 24D has a rectangular plan view shape. A first end portion (a left end portion in FIG. 6) of the semiconductor section 24D with respect to the X-axis direction is connected to the source electrode 24B and a second end portion (a right end portion in FIG. 6) with respect to the X-axis direction is connected to the drain electrode 24C. The semiconductor section 24D is disposed to overlap the gate electrode 24A via the gate insulating film 32. The TFT 24 is driven based on scan signals supplied to the gate electrode 24A. Through the driving of the TFT 24, the image signal that is supplied to the source electrode 24B through the source line 27 is supplied to the drain electrode 24C via the semiconductor section 24D. As a result, the pixel electrode 25 is charged at the potential related to the pixel signal.

Figure 7:
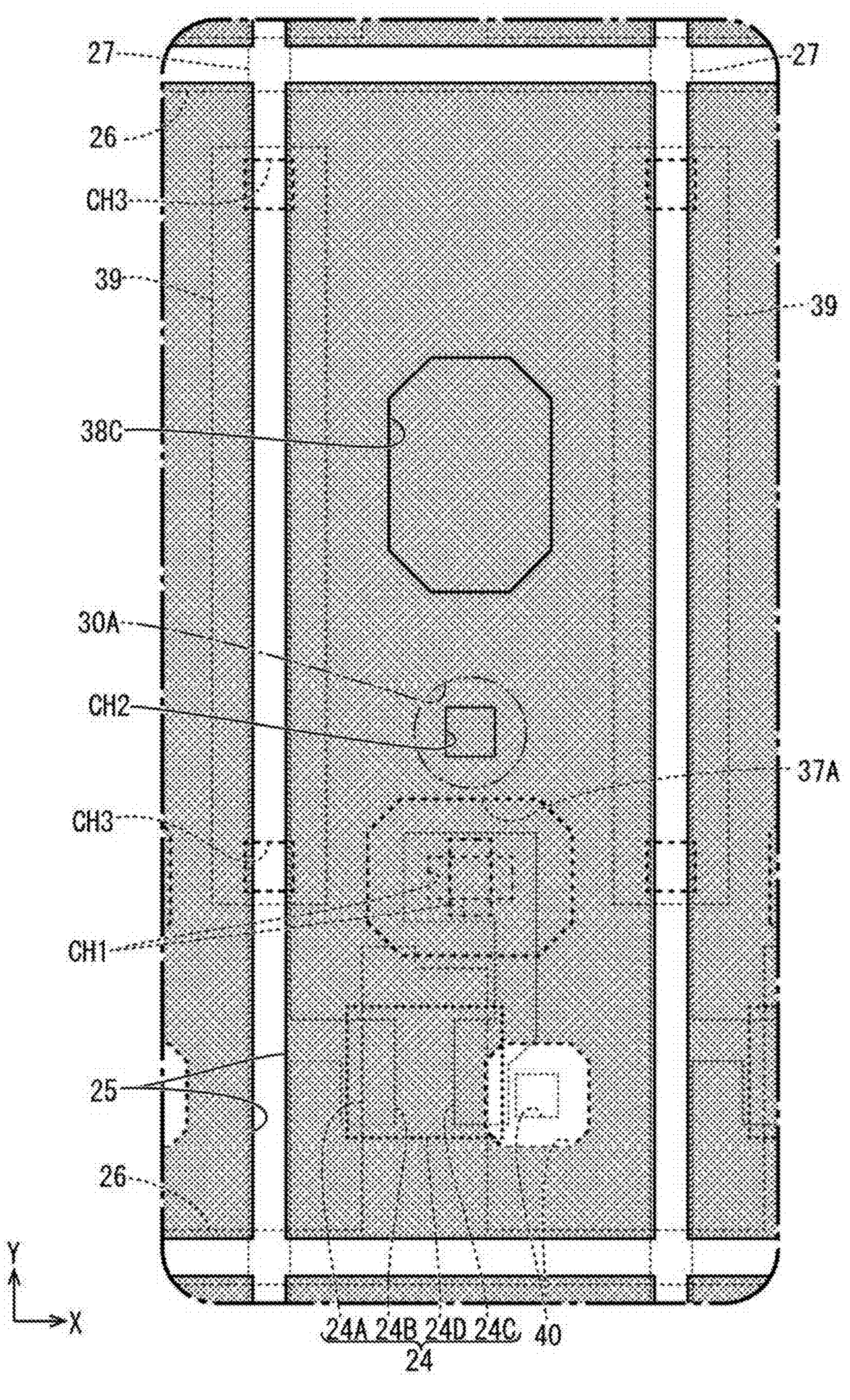
FIG. 7 is an enlarged plan view illustrating the pixel arrangement in the display area of the liquid crystal panel according to the first embodiment and illustrating a second transparent electrode film with a shading.
Figure 8:
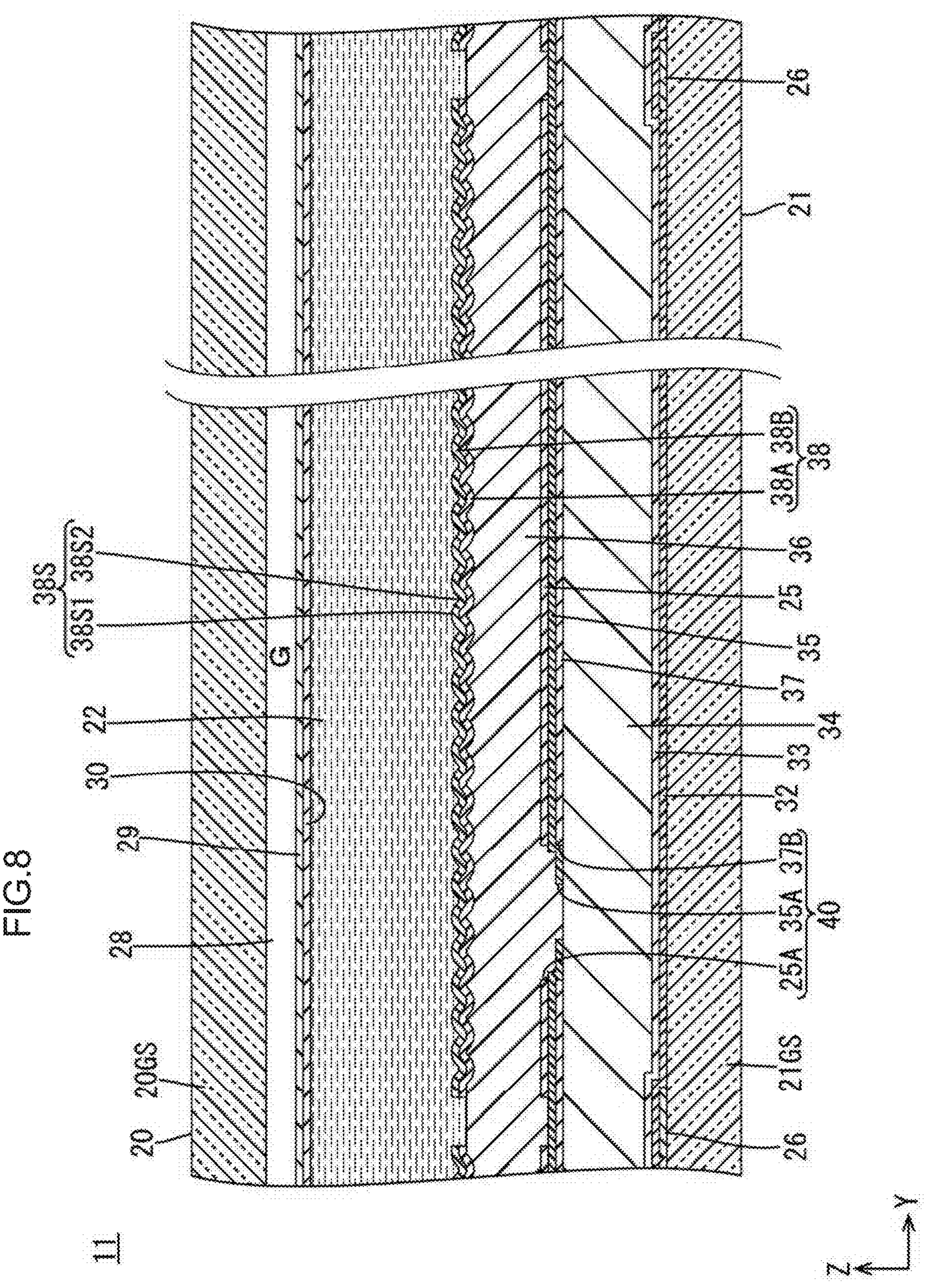
FIG. 8 is a cross-sectional view of the liquid crystal panel according to the first embodiment taken along line viii-viii in FIG. 3.

A configuration of the pixel electrode 25 will be described in detail with reference to FIGS. 4, 7, and 8. FIG. 7 illustrates a pixel arrangement of the same area in FIG. 3. The second transparent electrode film included in the array substrate 21 is illustrated with shading in FIG. 7. As illustrated in FIG. 7, the pixel electrode 25 is arranged in an area surrounded by the gate lines 26 and the source lines 27 and has a substantially rectangular plan view shape. The pixel electrode 25 is disposed to overlap a substantially entire area of the TFT 24. The pixel electrodes 25 are portions of the second transparent electrode film and are included in a layer upper than the layers including the gate lines 26 and the source lines 27 as illustrated in FIGS. 4 and 8. As illustrated in FIGS. 7 and 8, the dimension of the pixel electrode 25 measured in the Y-axis direction is slightly greater than the interval between the gate lines 26. Therefore, the pixel electrode 25 partially overlaps the gate line 26 and the outer edge of the pixel electrode 25 extending along the X-axis direction is away from the side edge of the gate line 26 and closer to a middle of the gate line 26 with respect to the line width direction (the Y-axis direction). As illustrated in FIGS. 4 and 7, the dimension of the pixel electrode 25 measured in the X-axis direction is almost same as the interval between the source lines 27. Therefore, the pixel electrode 25 is disposed such that the outer edge portions extending along the Y-axis direction overlaps the side edge portions of the source lines 27.

Figure 9:
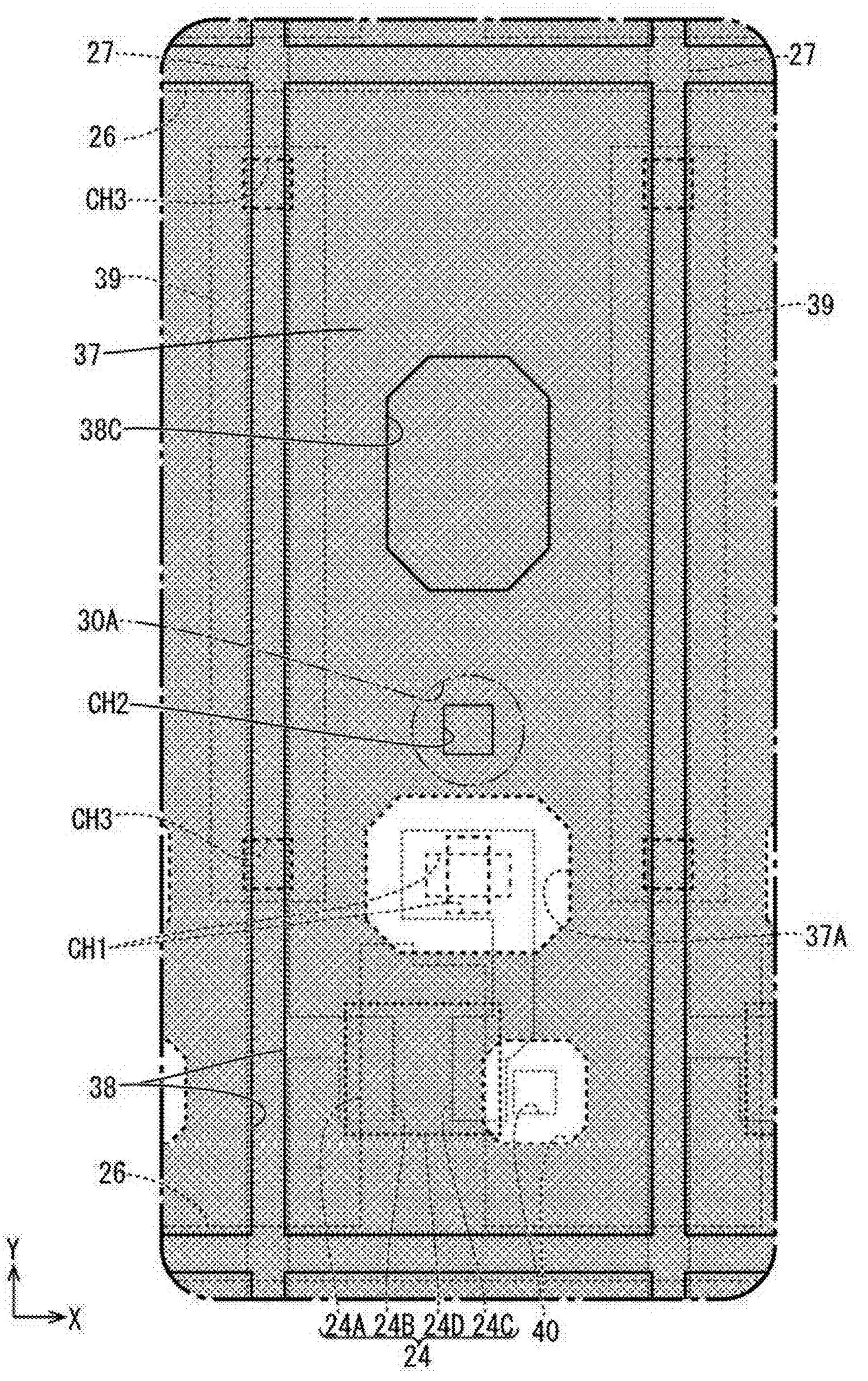
FIG. 9 is an enlarged plan view illustrating the pixel arrangement in the display area of the liquid crystal panel according to the first embodiment and illustrating a first transparent electrode film with a shading.

As illustrated in FIGS. 4 and 8, the array substrate 21 includes the common electrode 37 (a third electrode, a storage capacitance electrode). A storage capacitance is created between the pixel electrode 25 and the common electrode 37. In the following, a configuration of the common electrode 37 will be described in detail with reference to FIGS. 4, 5, 8, and 9. FIG. 9 illustrates a pixel arrangement of the same area in FIG. 3. The first transparent electrode film included in the array substrate 21 is illustrated with a shading in FIG. 9. As illustrated in FIGS. 4, 8, and 9, the common electrode 37 spreads over substantially an entire area of the display area. The common electrode 37 is a portion of the first transparent electrode film and is disposed to overlap all the pixel electrodes 25 arranged in the display area. The common electrode 37 is included in a layer lower than the layer including the pixel electrodes 25 via the inter-electrode insulating film 35. The common electrode 37, which is a portion of the first transparent electrode film, is included in a layer upper than the layers including the gate lines 26 and the source lines 27. The common electrode 37 is disposed in the areas (inter-pixel areas) between the pixel electrodes 25 that are adjacent to each other with respect to the X-axis direction and the Y-axis direction. Therefore, the common electrode 37 is disposed to overlap the gate lines 26 and the source lines 27. The common electrode 37 is supplied with the common potential signal, which has a common potential (a reference potential), from the back-plane circuit. The common electrode 37, which is charged at the common potential, is disposed to overlap the pixel electrode 25, which is charged by the TFT 24, via the inter-electrode insulating film 35. Therefore, a storage capacitance is created between the pixel electrode 25 and the common electrode 37. With using the storage capacitance, the potential of the charged pixel electrode 25 can be appropriately maintained. As illustrated in FIG. 5, the common electrode 37 includes first holes 37A in portions overlapping the pixel contact holes CH1, respectively. A portion of the pixel electrode 25 is in the first hole 37A. With the first holes 37A, the short-circuit of the pixel electrodes 25 and the common electrode 37 does not occur.

As illustrated in FIGS. 4 and 5, in this embodiment, the common electrode 37 is disposed in the layer upper than the layer including the source lines 27 and lower than the layer including the pixel electrodes 25. With such a configuration, parasitic capacitance is less likely to be created between the source lines 27 and the pixel electrodes 25. Furthermore, the first planarization film 34 that is included in the layer upper than the layer including the source lines 27 and lower than the layer including the common electrode 37 has a thickness greater than the thickness of the inter-electrode insulating film 35. This keeps flatness of the common electrode 37 that is included in the layer upper than the layer including the first planarization film 34. With flatness of the common electrode 37 being kept, flatness of the pixel electrode 25 that is included in the layer upper than the layer including the common electrode 37 via the inter-electrode insulating film 35 can be ensured. Therefore, variation in the distance between the pixel electrodes 25 and the common electrode 37 is less likely to be caused compared to the configuration including the common electrode that overlaps the reflection layer having an uneven surface via an insulating film. With such a configuration, a storage capacitance created between the pixel electrode 25 and the common electrode 37 can be stable and display quality is less likely to be lowered.

Figure 10:
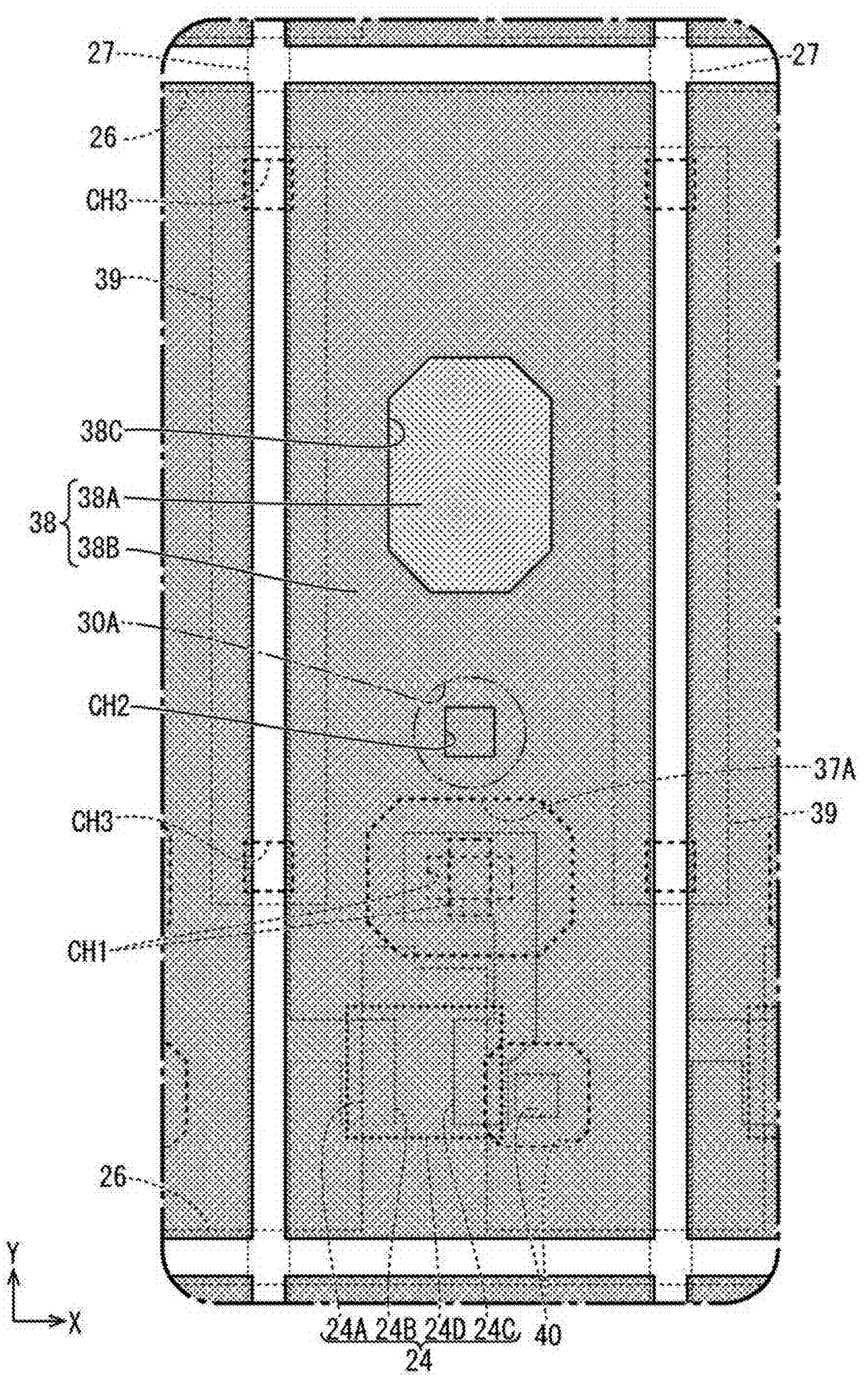
FIG. 10 is an enlarged plan view illustrating the pixel arrangement in the display area of the liquid crystal panel according to the first embodiment and illustrating a third transparent electrode film and a third metal film with different kinds of shadings.

As illustrated in FIGS. 4 and 8, the array substrate 21 includes the reflection electrodes 38 (a second electrode) for performing reflection displaying with using external light. In the following, a configuration of the reflection electrode 38 will be described in detail with reference to FIGS. 4, 5, 8, and 10. FIG. 10 illustrates a pixel arrangement of the same area in FIG. 3. The third transparent electrode film and the third metal film included in the array substrate 21 are illustrated with different types of shadings in FIG. 10. As illustrated in FIG. 5, the reflection electrode 38 has a multi-layered structure and includes a transparent electrode layer 38A and a reflection layer 38B that is disposed on the transparent electrode layer 38A. The transparent electrode layer 38A is a portion of the third transparent electrode film and effectively transmits light. The reflection layer 38B is a portion of the third metal film and effectively reflects light. The reflection electrodes 38 are included in a layer upper than the second transparent electrode film portions of which are configured as the pixel electrodes 25. The reflection electrode 38 has an uneven cross-sectional shape having recesses and projections. The reflection layer 38B that is on the outer surface side has an uneven surface 38S. The uneven surface 38S has projection portions 38S1 and recess portions 38S2. The projection portions 38S1 and the recess portions 38S2 are alternately included within a surface area of the uneven surface 38S and configured as the uneven surface 38S. The reflection electrode 38 has a cross-sectional shape corresponding to the cross-sectional shape of the second planarization film 36 that is disposed under the reflection electrode 38. Organic insulating material having photosensitivity is used as the material of the second planarization film 36 and the second planarization film 36 is exposed and developed with using a halftone mask or a gray tone that has a pattern corresponding to the uneven shape. Accordingly, the second planarization film 36 has the uneven cross-sectional shape. The reflection layer 38B of the reflection electrode 38 having the uneven surface 38S can reflect and diffuse external light and accordingly, display close to paperwhite can be achieved. The alignment film disposed on the reflection electrodes 38 has an uneven cross-sectional shape similar to that of the reflection electrodes 38.

As illustrated in FIG. 10, the reflection electrode 38 is arranged in an area surrounded by the gate lines 26 and the source lines 27 and has a vertically elongated rectangular plan view shape. The dimension of the reflection electrode 38 measured in the Y-axis direction is slightly greater than the interval between the gate lines 26 and the dimension of the reflection electrode 38 measured in the X-axis direction is substantially same as the interval between the source lines 27. Namely, the plan view size of the reflection electrode 38 is almost same as that of the pixel electrode 25 and the reflection electrode 38 is disposed to overlap a substantially entire area of the pixel electrode 25. As illustrated in FIG. 5, the reflection electrode 38 is connected to the pixel electrode 25. The second planarization film 36 that is disposed between the transparent electrode layer 38A of the reflection electrode 38 and the pixel electrode 25 has inter-electrode contact holes CH2 (a first contact hole). The inter-electrode contact hole CH2 is in a portion of the second planarization film 36 that overlaps the transparent electrode layer 38A and the pixel electrode 25. The inter-electrode contact hole CH2 is on the right side of the pixel contact hole CH1 in FIG. 5. With the transparent electrode layer 38A being connected to the pixel electrode 25 via the inter-electrode contact hole CH2, the reflection electrode 38 is charged at the same potential as that of the pixel electrode 25. Therefore, with the pixel electrode 25 being charged according to the driving of the TFT 24, the reflection electrode 38 is charged at the same potential as that of the pixel electrode and a storage capacitance is created between the pixel electrode 25 and the common electrode 37. Thus, the potential of the reflection electrode 38 can be appropriately maintained. With the reflection electrode 38 being disposed closest to the liquid crystal layer 22 except for the alignment film in the array substrate 21, an electric field having effective intensity is created between the reflection electrode 38 and the opposed electrode 30 that is disposed opposite the reflection electrode 38 via the liquid crystal layer 22. The orientations of the liquid crystal molecules included in the liquid crystal layer 22 are controlled by the electric field and the amount of light rays exiting toward the front side of the liquid crystal panel 11 is controlled for every pixel. Accordingly, a predefined image can be displayed in the display area. The opposed electrode 30 of the opposed substrate 20 has a hole 30A in a portion overlapping the inter-electrode contact hole CH2. The hole 30A is for controlling the orientations of the liquid crystal molecules included in the liquid crystal layer 22.

As illustrated in FIGS. 4, 8, and 10, the reflection electrode 38 includes light through holes 38C in the reflection layer 38B. The light through hole 38C is in the reflection layer 38B of the reflection electrode 38 but not in the transparent electrode layer 38A. The light through hole 38C is in a middle section of the reflection electrode 38 with respect to the X-axis direction and is disposed such that the inter-electrode contact hole CH2 is between the light through hole 38C and the inter-pixel contact hole CH1 with respect to the Y-axis direction. The light through hole 38C has a substantially rectangular plan view shape with four corners being cut off. Light supplied by the backlight unit toward the liquid crystal panel 11 travels through the transparent electrode layer 38A and passes through the light through hole 38C of the reflection layer 38B to the front side. With such a configuration, the reflection displaying using external light and the transmissive displaying using light from the backlight unit can be performed.

In this embodiment, as illustrated in FIGS. 4, 5, and 8, with the reflection electrode 38 being included in the layer upper than the layer including the pixel electrode 25, the light reflected by the reflection layer 38B of the reflection electrode 38 does not pass through the pixel electrode 25. Therefore, light is reflected by the reflection layer 38B of the reflection electrode 38 with low loss and can be used for displaying an image. With the thickness of the second planarization film 36 that is included in the layer lower than the layer including the reflection electrode 38 being greater than the thickness of the inter-electrode insulating film 35, the second planarization film 36 can be formed to have a cross-sectional shape as designed. Accordingly, the uneven surface 38S of the reflection layer 38B of the reflection electrode 38 also has a shape as designed.

Figure 11:
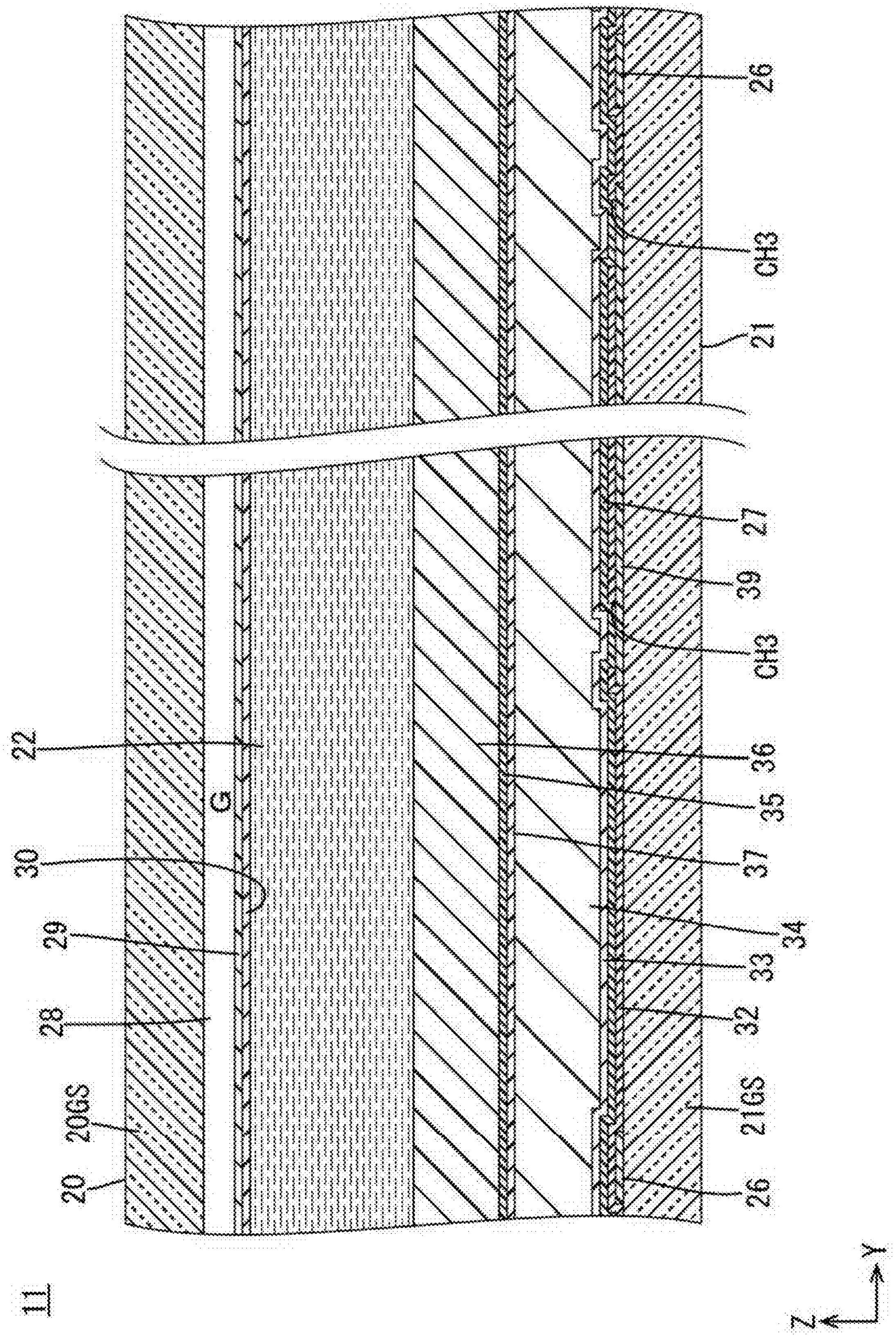
FIG. 11 is a cross-sectional view of the liquid crystal panel according to the first embodiment taken along line xi-xi in FIG. 3.

As illustrated in FIGS. 4 and 11, the array substrate 21 includes redundant lines 39 (a third line) that are connected to the source lines 27, respectively. In the following, a configuration of the redundant line 39 will be described in detail with reference to FIGS. 4, 6, and 11. As illustrated in FIGS. 4 and 11, the redundant lines 39 are portions of the first metal film and disposed to overlap the source lines 27 to be connected, respectively. As illustrated in FIG. 6, the redundant lines 39 extend along the source lines 27 and along the Y-axis direction. The width of the redundant line 39 is greater than the width of the source line 27 and is about three times as that of the source line 27. The redundant line 39 is disposed such that a center line of the redundant line 39 with respect to the width direction (the X-axis direction) matches a center line of the source line 27 with respect to the width direction. The redundant line 39 includes a middle section that overlaps the source line 27 and two side edge portions that sandwich the middle section. The two side edge portions that sandwich the middle section do not overlap the source line 27 and overlap the pixel electrodes 25 and the reflection electrodes 38. The redundant line 39 has a length extending from a first end that is close to and upper than the branch portion of the source line 27 from which the source electrode 24B extends to a second end that is close to and lower than the crossing point of the source line 27 and the gate line 26 in FIG. 6.

As illustrated in FIG. 11, the gate insulating film 32 that is disposed between the redundant line 39, which is a portion of the first metal film, and the source line 27, which is a portion of the second metal film, includes inter-line contact holes CH3 (a fourth contact hole). The inter-line contact hole CH3 is in a portion of the gate insulating film 32 that overlaps the redundant line 39 and the source line 27. The inter-line contact hole CH3 is formed to overlap each of the two end portions of the redundant line 39 with respect to the length direction (the Y-axis direction). Two inter-line contact holes CH3 are formed for each redundant line 39. The source line 27 is connected to the two end portions of the redundant line 39 with respect to the length direction via the two inter-line contact holes CH3. Therefore, even if disconnection occurs in the portion of the source line 27 between the two inter-line contact holes CH3, image signals that are transmitted from the signal supply side (the driver 12 side) can be transmitted toward a target component (an opposite side from the driver 12) via the redundant line 39. This ensures redundancy of the source lines 27. The redundant line 39 that is wider than the source line 27 can block the light traveling between the pixels that are adjacent to each other in the X-axis direction in the transmissive displaying. This suppresses mixing of colors between the pixels that exhibit different colors.

In this embodiment, as illustrated in FIG. 4, the storage capacitance is created by the pixel electrode 25 and the common electrode 37 that are included in the layers different from the layer including the redundant line 39. Therefore, even with the redundant line 39 being included, the area where the pixel electrode 25 and the common electrode 37 are arranged can be freely determined. A storage capacitance may be created with a configuration including a first electrode, which has a same potential as that of the pixel electrode 25 and is a portion of the same film (the second metal film) as the source line 27, and a second electrode, which has a common potential and is a portion of the same film (the first metal film) as the gate line 26 and is disposed to overlap the first electrode. Compared to such a configuration, in this embodiment, the area of overlapping portions of the pixel electrode 25 and the common electrode 37 increases. Accordingly, a storage capacitance created between the pixel electrode 25 and the common electrode 37 can be increased and the potential of the pixel electrode 25 can be maintained more stably.

As illustrated in FIG. 8, the array substrate 21 includes gas releasing holes 40 through which gas generated from the first planarization film 34 is released. In the following, a configuration of the gas releasing hole 40 will be described in detail with reference to FIGS. 7 to 9. The gas releasing hole 40 is formed in the common electrode 37, the inter-electrode insulating film 35, and the pixel electrode 25 that are disposed between the first planarization film 34 and the second planarization film 36. Specifically, the gas releasing hole 40 includes a second hole 37B formed in the common electrode 37, a third hole 35A formed in the inter-electrode insulating film 35, and a fourth hole 25A formed in the pixel electrode 25. The second hole 37B, the third hole 35A, and the fourth hole 25A that are communicated with each other are configured as the gas releasing hole 40. The second hole 37B and the fourth hole 25A have an almost same opening area. The opening area of the third hole 35A is smaller than that of the second hole 37B and the fourth hole 25A. As illustrated in FIGS. 7 and 9, the gas releasing hole 40 is next to the drain electrode 24C and the semiconductor section 24D of the TFT 24 in a plan view. Namely, the gas releasing hole 40 does not overlap at least the source line 27. The second hole 37B formed in the common electrode 37 does not overlap at least the source line 27. With such a configuration, an electric field created by the source line 27 can be effectively blocked by the common electrode 37. With acrylic resin material being used as the organic insulating material for the first planarization film 34 and the second planarization film 36, gas such as ethylene gas and propane gas may come out from the first planarization film 34 and the second planarization film 36 as time passes after forming the films. If gas is generated from the first planarization film 34, the gas can be released toward the second planarization film 36 through the second hole 37B, the third hole 35A, and the fourth hole 25A of the gas releasing hole 40. The gas generated from the first planarization film 34 and the second planarization film 36 can be released toward the liquid crystal layer 22 via the portions of the second planarization film 36 that are not covered by the reflection electrodes 38. Thus, the gas generated from the first planarization film 34 and the second planarization film 36 can be released.

As previously described, the liquid crystal panel 11 (the display device) of this embodiment includes the TFTs 24 (the switching component), the pixel electrodes 25 (the first electrode) connected to the TFTs 24, the source lines 27 (the first line) connected to the TFTs 24 and included in the layer lower than the layer including the pixel electrodes 25 and being for transmitting image signals to be supplied to the pixel electrodes 25, the reflection electrodes 38 (the second electrode) included in the layer upper than the layer including the source lines 27, the common electrode 37 (the third electrode) included in the layer lower than the layer including the pixel electrodes 25 and upper than the layer including the source lines 27, the inter-electrode insulating film 35 (the first insulating film) disposed between the pixel electrodes 25 and the common electrode 37, and the first planarization film 34 (the second insulating film) included in the layer upper than the layer including the source lines 27 and lower than the layer including the common electrode 37. The reflection electrode 38 includes the reflection layer 38B that reflects light and the reflection layer 38B has the uneven surface 38S. The common electrode 37 is disposed to overlap at least the pixel electrodes 25 and the source lines 27 and charged at the common potential. The thickness of the first planarization film 34 is greater than that of the inter-electrode insulating film 35.

With the TFT 24 being driven, the pixel electrode 25 is charged at a potential based on the image signal transmitted via the source line 27. With the pixel electrode 25 being disposed to overlap the common electrode 37 having a common potential via the inter-electrode insulating film 35, a storage capacitance is created between the pixel electrode 25 and the common electrode 37. With using the storage capacitance, the potential of the charged pixel electrode 25 can be appropriately maintained. On the other hand, with the reflection layer 38B of the reflection electrode 38 reflecting light, an image can be displayed with using external light. With the reflection layer 38B of the reflection electrode 38 having the uneven surface 38S, external light is reflected and diffused by the reflection layer 38B and displaying close to paperwhite can be achieved.

The common electrode 37 is disposed in the layer upper than the layer including the source lines 27 and lower than the layer including the pixel electrodes 25. With such a configuration, parasitic capacitance is less likely to be created between the source lines 27 and the pixel electrodes 25. Furthermore, the first planarization film 34 that is included in the layer upper than the layer including the source lines 27 and lower than the layer including the common electrode 37 has a thickness greater than the thickness of the inter-electrode insulating film 35. This keeps flatness of the common electrode 37 that is included in the layer upper than the layer including the first planarization film 34. With flatness of the common electrode 37 being kept, flatness of the pixel electrode 25 that is included in the layer upper than the layer including the common electrode 37 via the inter-electrode insulating film 35 can be ensured. Therefore, variation in the distance between the pixel electrodes 25 and the common electrode 37 is less likely to be caused compared to the configuration including the common electrode that overlaps the reflection layer having an uneven surface via an insulating film. Accordingly, a storage capacitance created between the pixel electrode 25 and the common electrode 37 can be stable and display quality is less likely to be lowered.

The reflection electrodes 38 are included in the layer upper than the layer including the pixel electrodes 25. The second planarization film 36 (the third insulating film), which is thicker than the inter-electrode insulating film 35, is disposed between the reflection electrodes 38 and the pixel electrodes 25. With the reflection electrode 38 being included in the layer upper than the layer including the pixel electrode 25, the light reflected by the reflection layer 38B of the reflection electrode 38 does not pass through the pixel electrodes 25. Therefore, light is reflected by the reflection layer 38B of the reflection electrode 38 with low loss and can be used for displaying an image. With the thickness of the second planarization film 36 that is included in the layer lower than the layer including the reflection electrodes 38 being greater than the thickness of the inter-electrode insulating film 35, reproduction of the shape of the uneven surface 38S of the reflection layer 38B of the reflection electrode 38 can be effectively achieved.

The liquid crystal panel 11 further includes the opposed electrode 30 (the fourth electrode) that is disposed opposite the reflection electrode 38 with a gap therebetween and has the common potential and the liquid crystal layer 22 that is disposed between the reflection electrode 38 and the opposed electrode 30. The reflection electrode 38 is disposed to overlap the pixel electrode 25. The second planarization film 36 has the inter-electrode contact holes CH2 (the first contact hole). The inter-electrode contact hole CH2 is in a portion of the second planarization film 36 that overlaps the reflection electrode 38 and the pixel electrode 25. The reflection electrode 38 is connected to the pixel electrode 25 via the inter-electrode contact hole CH2. With the reflection electrode 38 being charged at the same potential as that of the pixel electrode 25, an electric field having effective intensity is created between the reflection electrode 38 and the opposed electrode 30. The orientations of the liquid crystal molecules included in the liquid crystal layer 22 are appropriately controlled by the electric field created between the reflection electrode 38 and the opposed electrode 30.

The liquid crystal panel 11 further includes the gate lines 26 (the second line) that are connected to the TFTs 24 for transmitting scan signals and cross the source lines 27, the gate insulating film 32 (a fifth insulating film) that is included in the layer upper than the layer including the source lines 27 and lower than the layer including the gate lines 26, and the redundant lines 39 (the third line) that are included in the layer lower than the layer including the gate insulating film 32 and disposed to overlap the source lines 27. The gate insulating film 32 includes the inter-line contact holes CH3 (the fourth contact hole). The inter-line contact hole CH3 is in a portion of the gate insulating film 32 that overlaps the source line 27 and the redundant line 39. The source line 27 and the redundant line 39 are connected via the inter-line contact hole CH3. The scan signal transmitted through the gate line 26 is supplied to the TFT 24 and the TFT 24 is driven. The source line 27 is connected to the redundant line 39 via the inter-line contact holes CH3 formed in the gate insulating film 32. Even if disconnection occurs in the source line 27, image signals can be transmitted via the redundant line 39. This ensures redundancy of the source lines 27. A storage capacitance is created by the pixel electrode 25 and the common electrode 37 that are included in the layers different from the layer including the redundant line 39. Therefore, even with the redundant line 39 being disposed, the area where the pixel electrode 25 and the common electrode 37 are arranged can be freely determined. A storage capacitance may be created with a configuration including a first electrode, which has a same potential as that of the pixel electrode 25 and is a portion of the same film as the source line 27, and a second electrode, which has a common potential and is a portion of the same film as the gate line 26 and disposed to overlap the first electrode. Compared to such a configuration, in this embodiment, the area of overlapping portions of the pixel electrode 25 and the common electrode 37 increases. Accordingly, a storage capacitance created between the pixel electrode 25 and the common electrode 37 can be increased.

Second Embodiment

A second embodiment will be described with reference to FIGS. 12 to 19. In an array substrate 121 of the second embodiment, the order in which the films are disposed on the inner surface side of the array substrate 121 and configurations of a pixel electrode 125, a common electrode 137, and a reflection electrode 138 differ from those of the first embodiment. Configurations, operations, and effects similar to those of the first embodiment may not be described.

Figure 13:
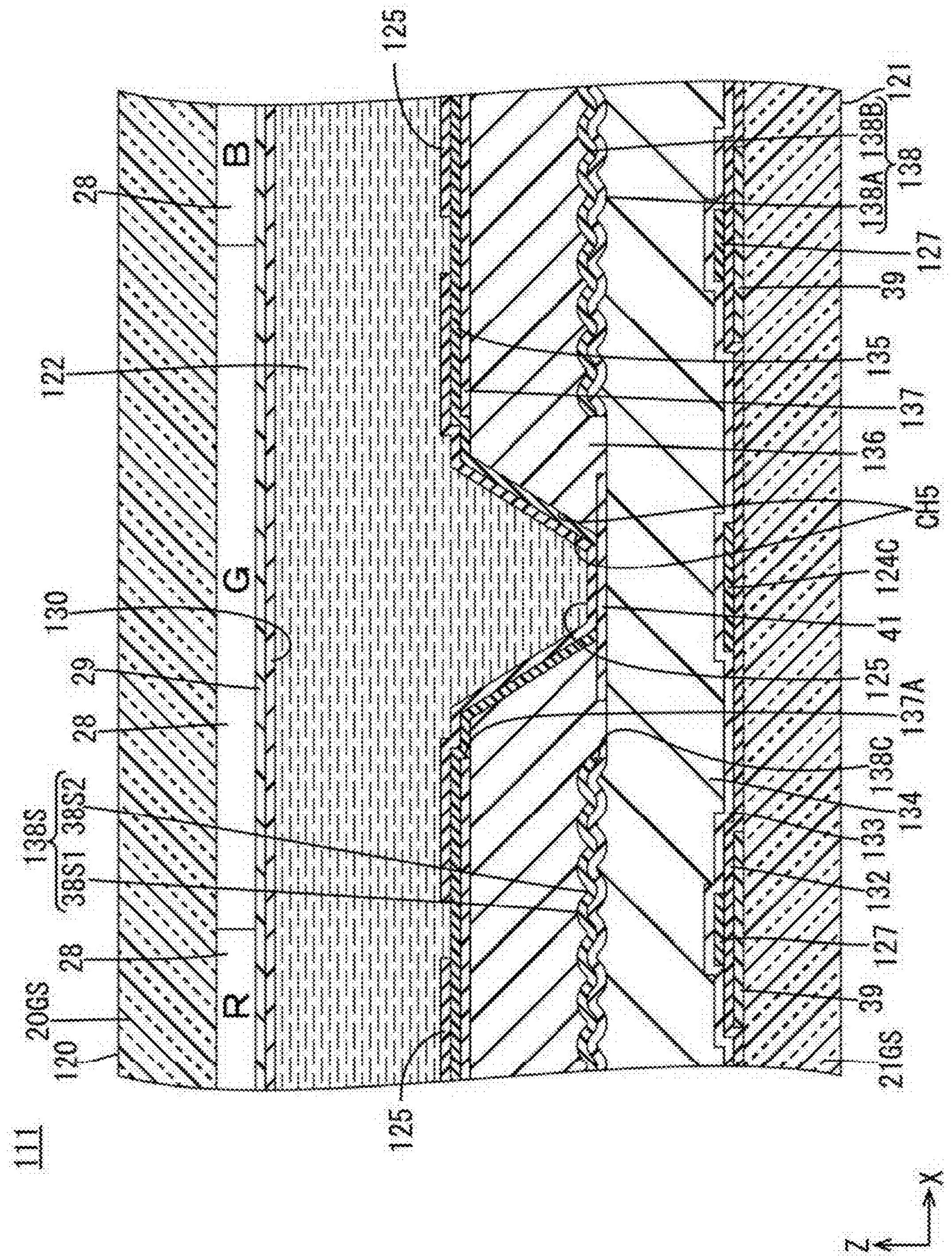
FIG. 13 is a cross-sectional view of the liquid crystal panel according to the second embodiment taken along line xiii-xiii in FIG. 12.
Figure 14:
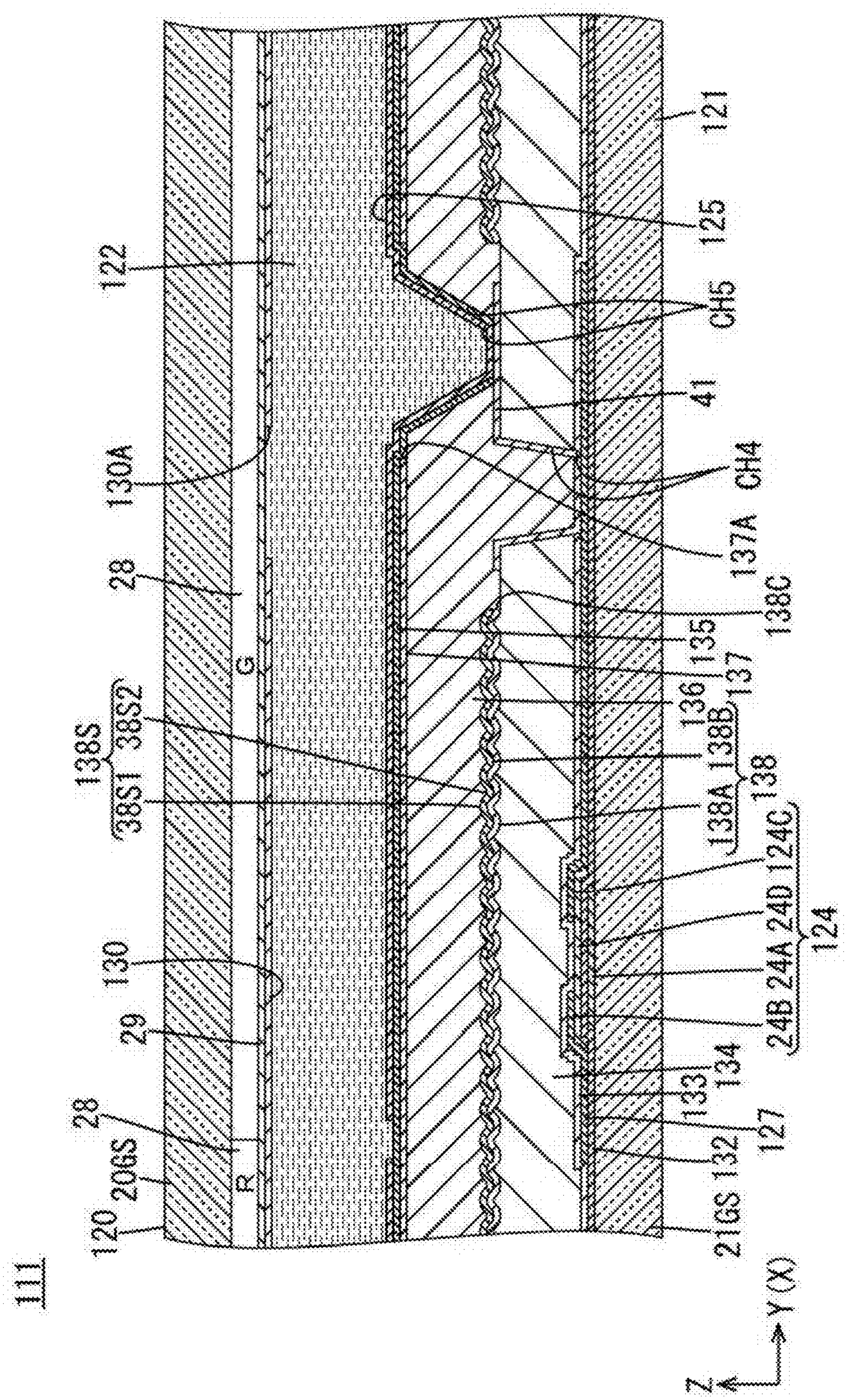
FIG. 14 is a cross-sectional view of the liquid crystal panel according to the second embodiment taken along line xiv-xiv in FIG. 12.

Films disposed on top of each other on the inner surface side of the array substrate 121 of a liquid crystal panel 111 of this embodiment will be described with reference to FIGS. 13 and 14. As illustrated in FIGS. 13 and 14, on the glass substrate 21GS of the array substrate 121, the first metal film, a gate insulating film 132 (the fifth insulating film), the semiconductor film, the second metal film, an interlayer insulating film 133, a first planarization film 134 (a fourth insulating film), the first transparent electrode film, the third metal film, a second planarization film 136 (the second insulating film), the second transparent electrode film, an inter-electrode insulating film 135 (the first insulating film), the third transparent electrode film, and the alignment film are disposed on top of each other in this sequence from a lower layer side.

Figure 12:
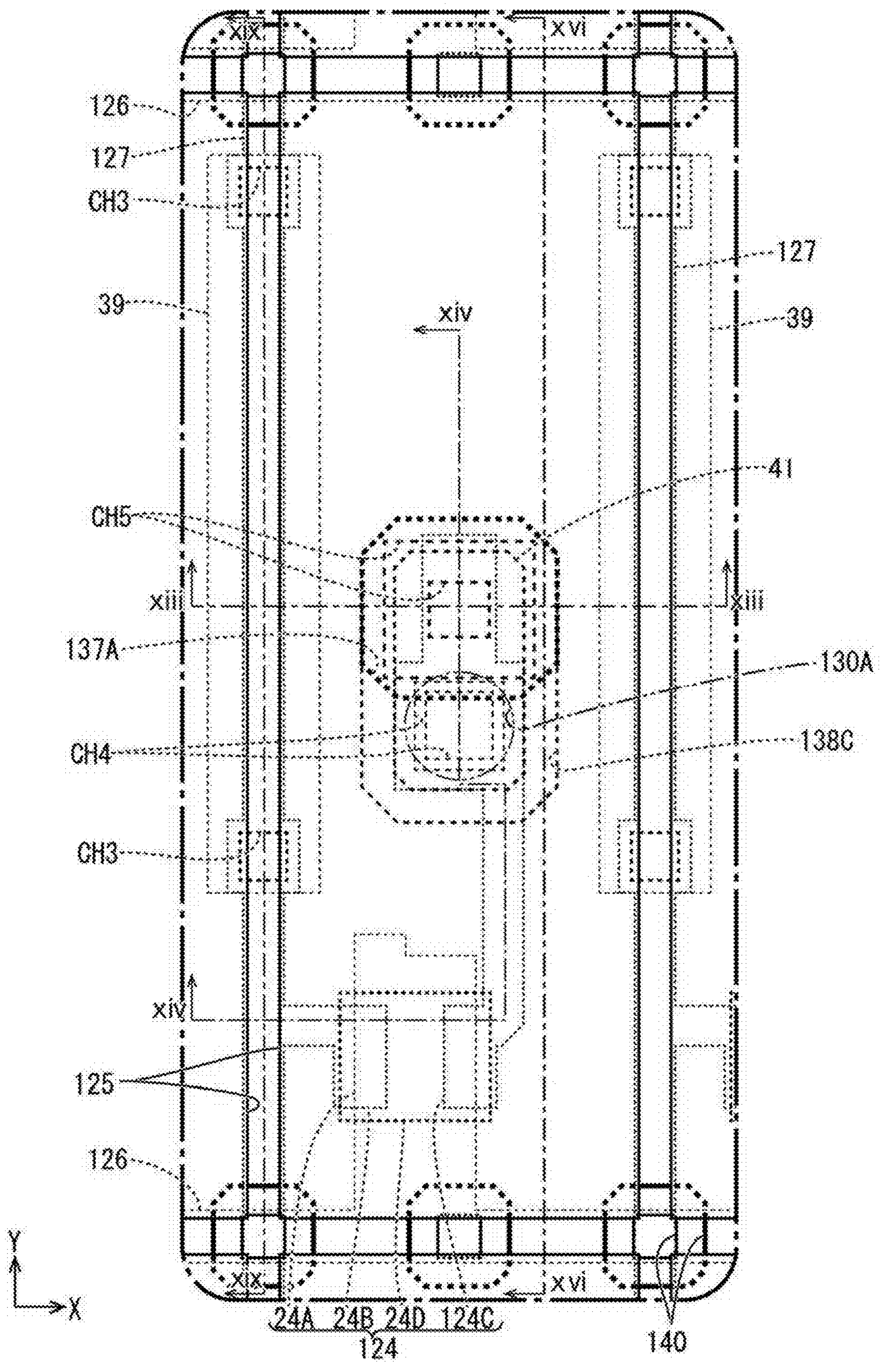
FIG. 12 is an enlarged plan view illustrating a pixel arrangement in the display area of a liquid crystal panel according to a second embodiment.
Figure 15:
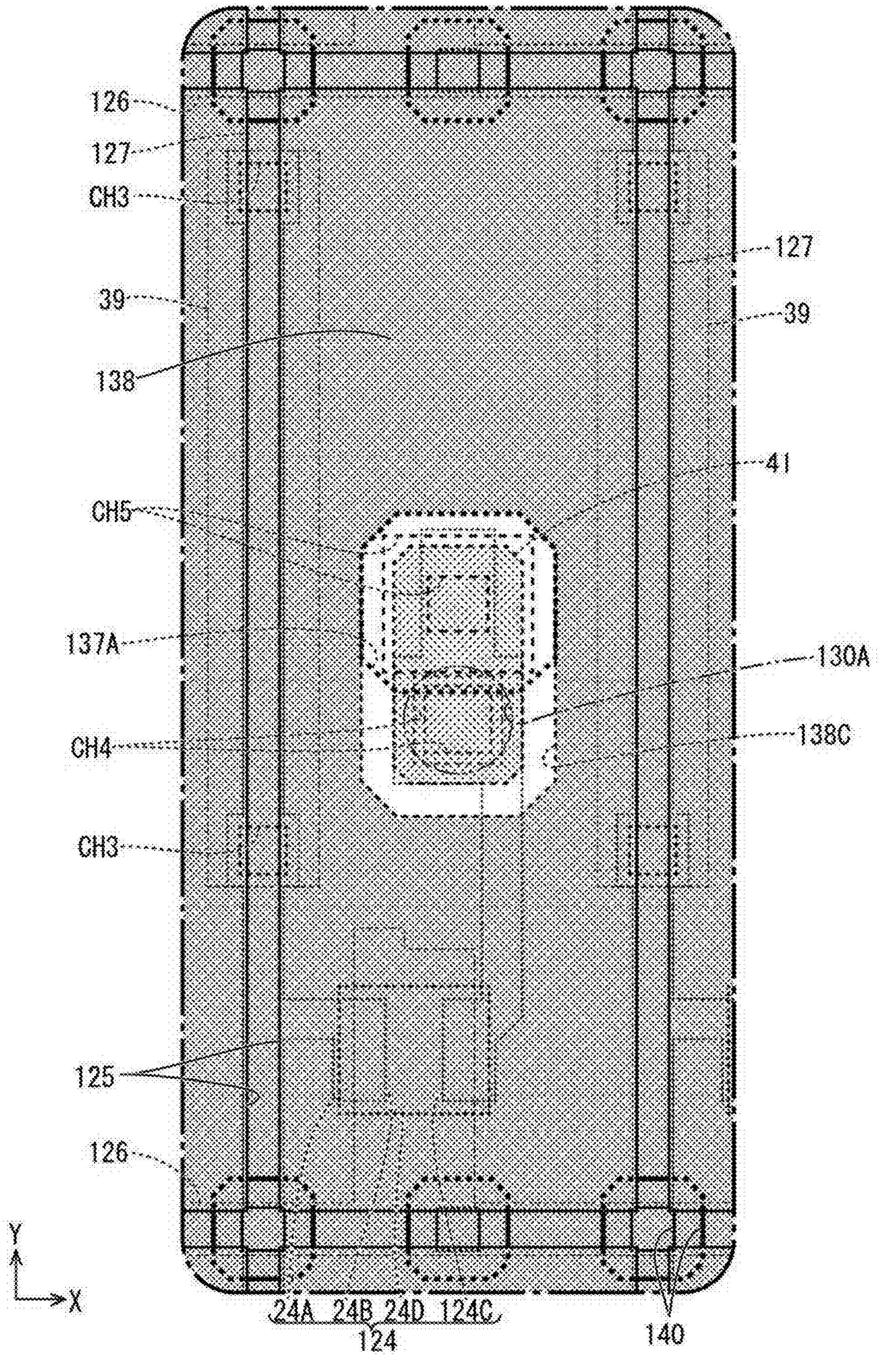
FIG. 15 is an enlarged plan view illustrating the pixel arrangement in the display area of the liquid crystal panel according to the second embodiment and illustrating a first transparent electrode film and a third metal film with different kinds of shadings.
Figure 16:
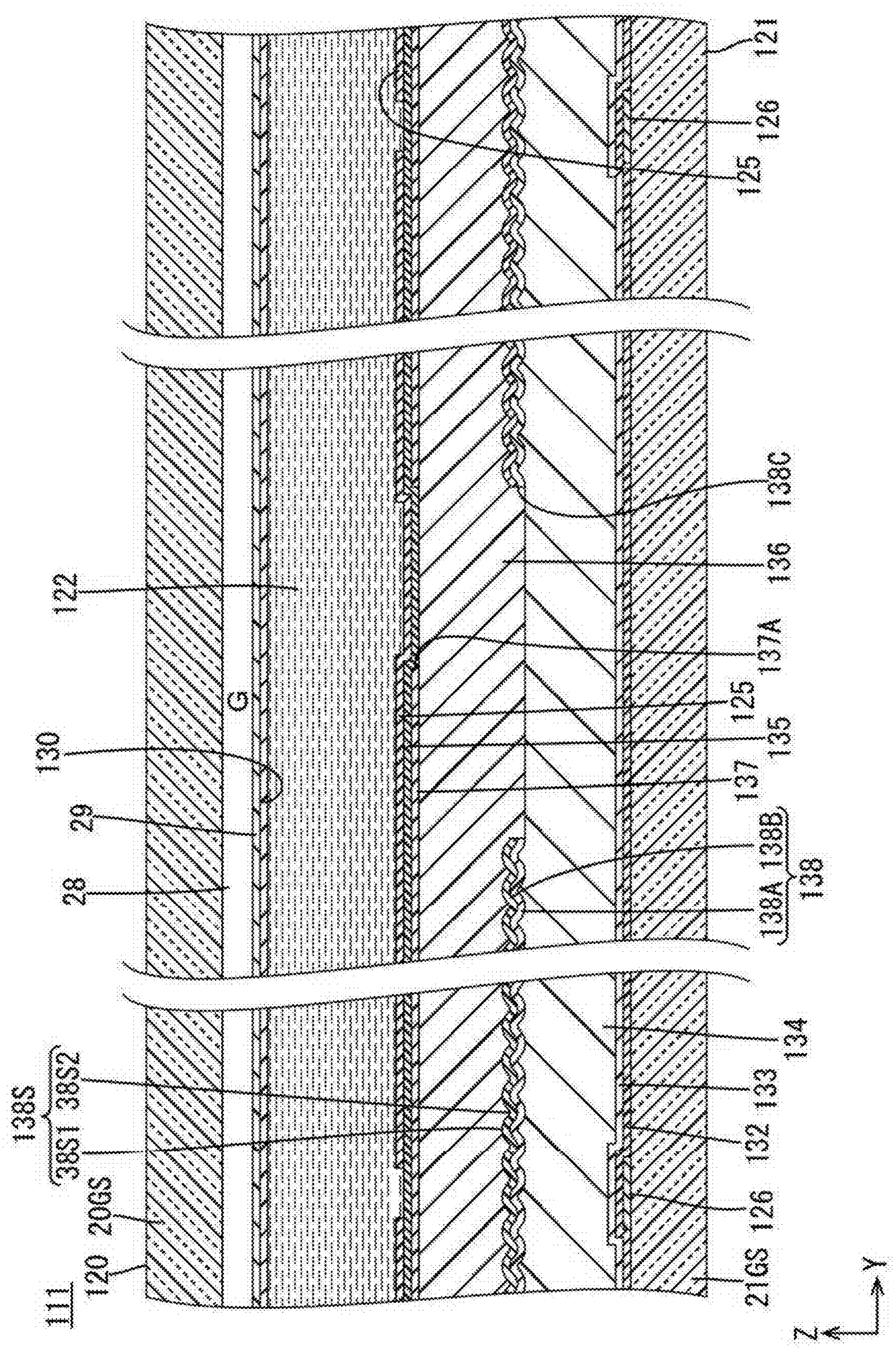
FIG. 16 is a cross-sectional view of the liquid crystal panel according to the second embodiment taken along line xvi-xvi in FIG. 12.

As illustrated in FIGS. 12 and 13, the reflection electrode 138 of this embodiment is included in a layer lower than layers including the pixel electrodes 125 and the common electrode 137. Specifically, the reflection electrode 138 is included in the layer upper than a layer including the first planarization film 134 and lower than a layer including the second planarization film 136. As illustrated in FIGS. 13, 15, and 16, the reflection electrode 138 includes a transparent electrode layer 138A that is a portion of the first transparent electrode film and a reflection layer 138B that is a portion of the third metal film. In this embodiment, the reflection electrode 138 is supplied with a common signal having a common potential from a backplane circuit. The reflection electrode 138 is disposed in a solid manner over a substantially entire area of the display area. The reflection electrode 138 is included in a layer upper than the layers including the gate lines 126 and the source lines 127. The reflection electrode 138 is disposed in areas (an inter-pixel area) between the pixel electrodes 125 that are adjacent to each other in the X-axis direction and the Y-axis direction. Therefore, the reflection electrode 138 is disposed to overlap the gate lines 126 and the source lines 127. The reflection electrode 138 has an uneven cross-sectional shape and the reflection layer 138B that is on the outer surface side has an uneven surface 138S. The reflection electrode 138 has a cross-sectional shape corresponding to the cross-sectional shape of the first planarization film 134 that is disposed under the reflection electrode 138. Organic insulating material having photosensitivity is used as the material of the first planarization film 134 and the first planarization film 134 is exposed and developed with using a halftone mask or a gray tone that has a pattern corresponding to the uneven shape. Accordingly, the first planarization film 134 has the uneven cross-sectional shape. As illustrated in FIG. 13, the reflection electrode 138 includes light through holes 138C in the reflection layer 138B and a transparent electrode layer 138A. Portions of the reflection electrode 138 missing the transparent electrode layer 138A and the reflection layer 138B are configured as the light through holes 138C.

Figure 17:
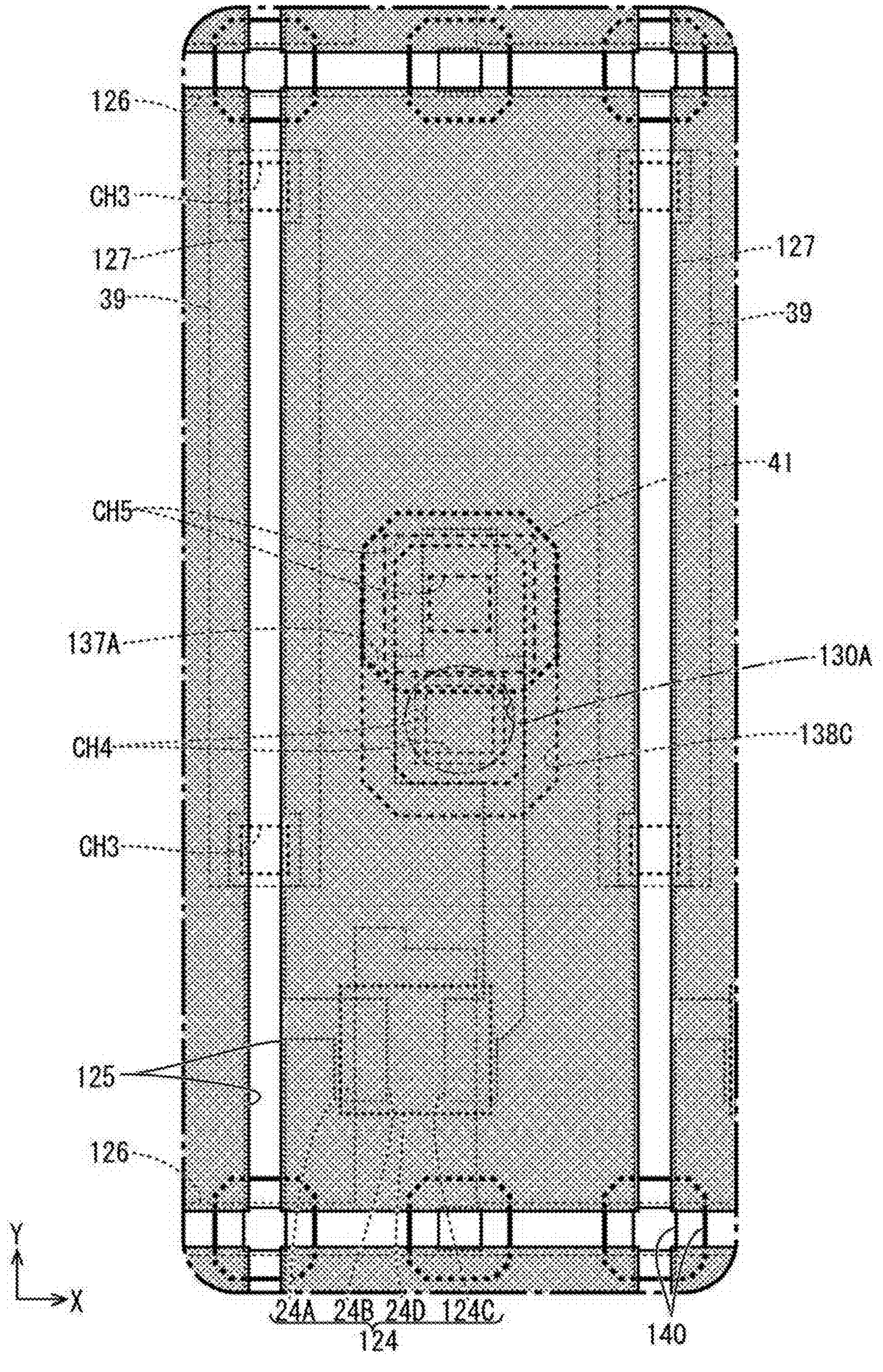
FIG. 17 is an enlarged plan view illustrating the pixel arrangement in the display area of the liquid crystal panel according to the second embodiment and illustrating a third transparent electrode film with a shading.

As illustrated in FIGS. 13, 14, and 17, the pixel electrodes 125 are portions of the third transparent electrode film. With the pixel electrodes 125 being disposed closest to the liquid crystal layer 122 except for the alignment film in the array substrate 121, an electric field having effective intensity is created between the pixel electrodes 125 and the opposed electrode 130 that is disposed opposite the pixel electrodes 125 via the liquid crystal layer 122. The orientations of the liquid crystal molecules included in the liquid crystal layer 122 are controlled by the electric field and the amount of light rays exiting toward the front side of the liquid crystal panel 111 is controlled for every pixel. Accordingly, a predefined image can be displayed in the display area.

As illustrated in FIGS. 13 to 15, the pixel electrode 125, which is a portion of the third transparent electrode film, is connected to a drain electrode 124C, which is a portion of the second metal film, via an intermediate electrode 41 (a fifth electrode) that is in a middle with respect a layered direction (the Z-axis direction). The intermediate electrode 41 is a portion of the first transparent electrode film. Namely, the intermediate electrode 41 is included in a same layer as the transparent electrode layer 138A of the reflection electrode 138. The intermediate electrode 41, which is a portion of the first transparent electrode film, does not include the third metal film a portion of which is configured as the reflection electrode 138. Therefore, the intermediate electrode 41 transmits light and even if an extra portion of the third metal film for forming the reflection layer 138B remains, short-circuit is less likely to occur between the remaining extra portion of the third metal film and the reflection electrode 138. As illustrated in FIG. 15, the intermediate electrode 41 is arranged in the light through hole 138C of the reflection electrode 138 and has an island shape surrounded by hole edges of the light through hole 138C. The intermediate electrode 41 has a vertically elongated rectangular plan view shape and is disposed to overlap the drain electrode 124C and the pixel electrode 125 to be connected. In other words, the drain electrode 124C extends such that a portion of the drain electrode 124C is in an area inside the light through hole 138C. In detail, the intermediate electrode 41 is disposed such that a first end portion thereof (a lower portion in FIG. 15) with respect to the Y-axis direction overlaps the drain electrode 124C and the pixel electrode 125 and a second end portion thereof (an upper portion in FIG. 15) with respect to the Y-axis direction does not overlap the drain electrode 124C but overlaps the pixel electrode 125.

As illustrated in FIGS. 13 and 14, the interlayer insulating film 133 and the first planarization film 134 that are disposed between the intermediate electrode 41 and the drain electrode 124C include a first pixel contact hole CH4 (a second contact hole) that is through the films 133, 134. The interlayer insulating film 133 and the first planarization film 134 include the first pixel contact holes CH4 in portions overlapping the intermediate electrode 41 and the drain electrode 124C. The intermediate electrode 41 is connected to the drain electrode 124C via the first pixel contact hole CH4. The second planarization film 136 and the inter-electrode insulating film 135 that are disposed between the pixel electrode 125 and the intermediate electrode 41 include a second pixel contact hole CH5 (a third contact hole) that is through the films 136, 135. The second pixel contact hole CH5 is formed in a portion of each of the second planarization film 136 and the inter-electrode insulating film 135 that does not overlap the drain electrode 124C but overlaps the pixel electrode 125 and the intermediate electrode 41 (specifically, on the right side of the first pixel contact hole CH4 in FIG. 14). The pixel electrode 125 is connected to the intermediate electrode 41 via the second pixel contact hole CH5. Thus, the pixel electrode 125 is connected to the drain electrode 124C of the TFT 124 via the intermediate electrode 41. As illustrated in FIG. 14, the inclination of hole edge walls of the second pixel contact hole CH5 in the second planarization film 136 and the inter-electrode insulating film 135 is more gentle than the inclination of hole edge walls of the first pixel contact hole CH4 in the interlayer insulating film 133 and the first planarization film 134. According to such a configuration, when the material of the alignment film is disposed with coating on an innermost surface of the array substrate 121, the material of the alignment film easily flows into the second pixel contact hole CH5 and the alignment film can be uniformly formed. The opposed electrode 130 of the opposed substrate 120 includes a hole 130A in a portion overlapping the first pixel contact hole CH4.

Figure 18:
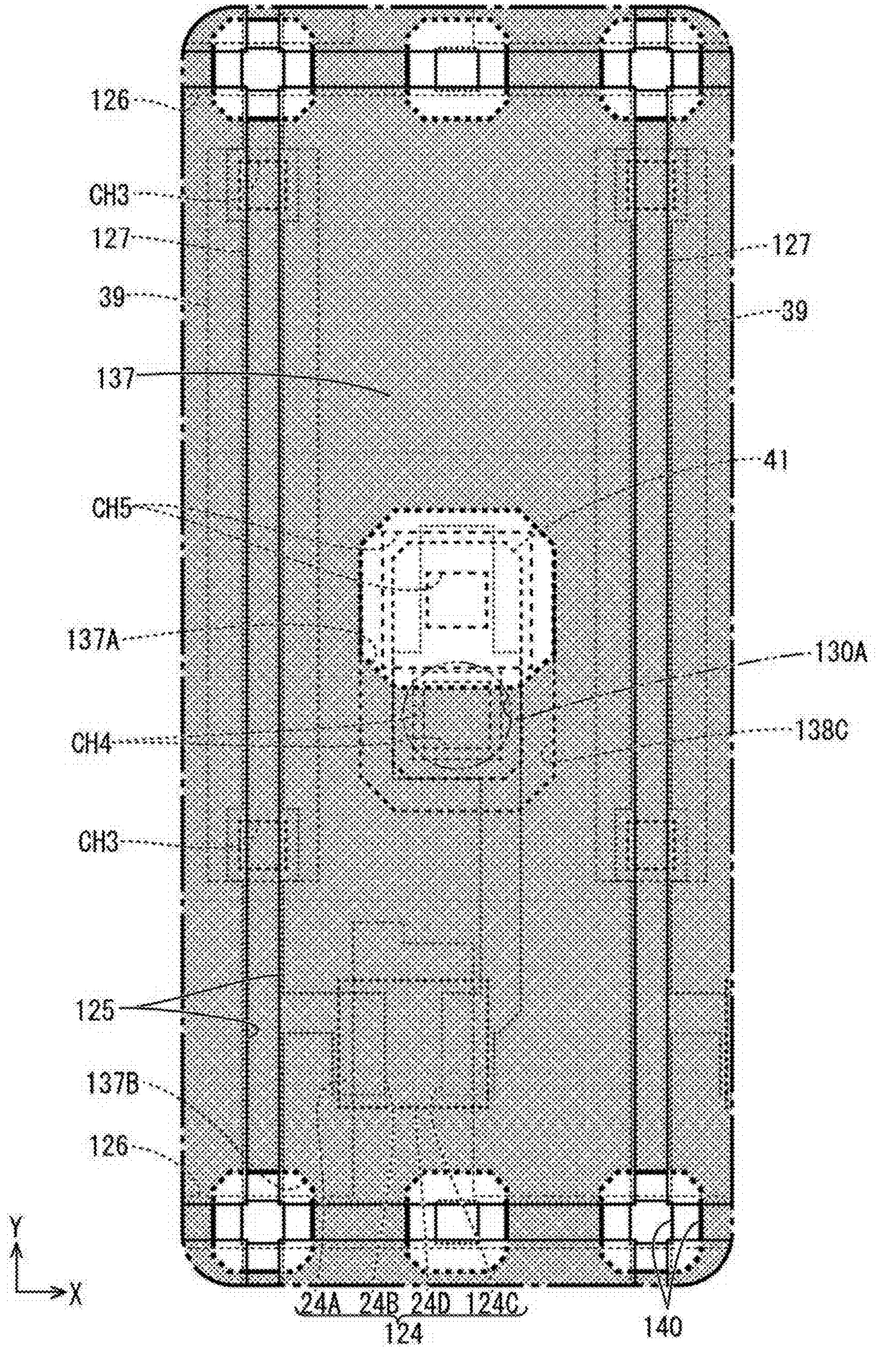
FIG. 18 is an enlarged plan view illustrating the pixel arrangement in the display area of the liquid crystal panel according to the second embodiment and illustrating a second transparent electrode film with a shading.

As illustrated in FIGS. 13, 16, and 18, the common electrode 137 of this embodiment is a portion of the second transparent electrode film. The common electrode 137, which is a portion of the second transparent electrode film, is included in a layer lower than the layer including the pixel electrodes 125 and overlaps the pixel electrodes 125 via the inter-electrode insulating film 135. A storage capacitance is created between the common electrode 137 having a common potential and the pixel electrode 125 that is charged by the TFT 124. Therefore, the potential of the charged pixel electrode 125 can be appropriately maintained. As illustrated in FIGS. 13 and 16, the common electrode 137 includes first holes 137A in portions overlapping the second pixel contact holes CH5, respectively. A portion of the pixel electrode 125 is in the first hole 137A.

As illustrated in FIGS. 13 and 16, the pixel electrodes 125 and the common electrode 137 are disposed in the layer upper than the layer including the second planarization film 136 and are planarized by the second planarization film 136 that is thicker than the inter-electrode insulating film 15. Therefore, the cross-sectional shapes of the pixel electrodes 125 and the common electrode 137 are less likely to be affected by the uneven surface 138S of the reflection layer 138B of the reflection electrode 138. Thus, flatness of the pixel electrodes 125 and the common electrode 137 are effectively ensured. Therefore, variation in a distance between the pixel electrodes 125 and the common electrode 137 is less likely to be caused compared to the configuration including the common electrode that overlaps the reflection layer having an uneven surface via an insulating film. With such a configuration, a storage capacitance created between the pixel electrode 125 and the common electrode 137 can be stable and display quality is less likely to be lowered. Particularly, the pixel electrodes 125 are included in the most upper layer of the array substrate 121 subsequent to the alignment film and the uneven surface 138S of the reflection layer 138B of the reflection electrode 138 is not exposed as the most upper layer subsequent to the alignment film. Therefore, the volume of the liquid crystal layer 122 is less likely to be changed.

Furthermore, in this embodiment, as illustrated in FIGS. 13 and 16, in addition to the common electrode 137 having the common potential, the reflection electrode 138 having the common potential is included in the layer upper than the layer including the source lines 127 and lower than the layer including the pixel electrodes 125. Therefore, an electric field created by the source line 127 can be effectively blocked by the common electrode 137 and the reflection electrode 138. Accordingly, a parasitic capacitance is less likely to be created between the source line 127 and the pixel electrode 125.

Figure 19:
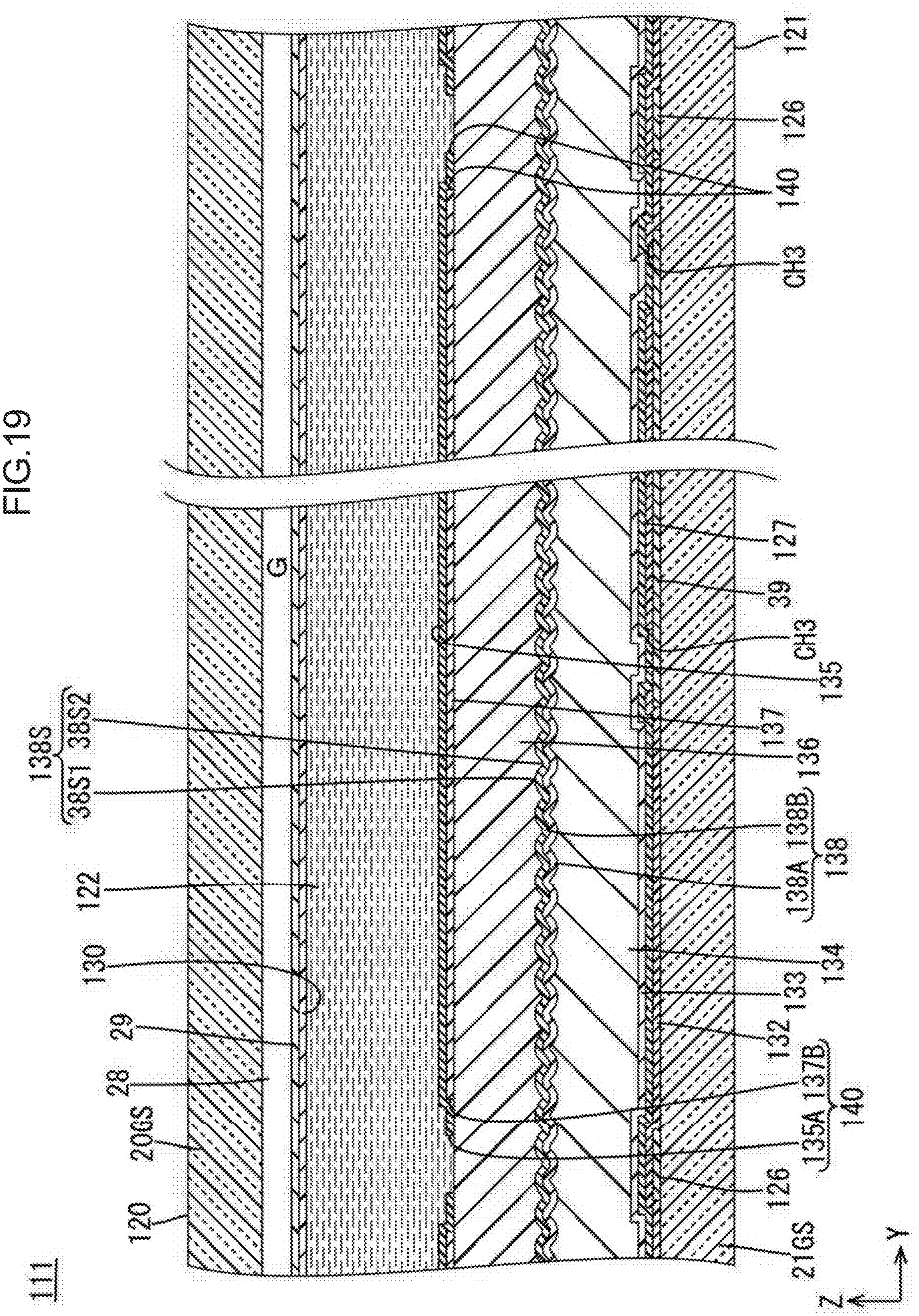
FIG. 19 is a cross-sectional view of the liquid crystal panel according to the second embodiment taken along line xix-xix in FIG. 12.

As illustrated in FIG. 19, a gas releasing hole 140 is formed in the common electrode 137 and the inter-electrode insulating film 135 that are included in the upper layer than the layer including the second planarization film 136. More in detail, the gas releasing hole 140 includes a second hole 137B formed in the common electrode 137 and a third hole 135A formed in the inter-electrode insulating film 135. The second hole 137B and the third hole 135A that are communicated with each other are configured as the gas releasing hole 140. As illustrated in FIGS. 17 and 18, the gas releasing holes 140 are formed to overlap the gate line 126 in a plan view and between two pixel electrodes 125 that are adjacent to each other with respect to the Y-axis direction. The gas releasing holes 140 are arranged at intervals on the gate line 126 along the X-axis direction. The interval between the gas releasing holes 140 is about a half of the interval between the source lines 127. More in detail, the gas releasing hole 140 is formed at every crossing portion of the gate lines 126 and the source line 127 and a middle section between two source lines 127 that are adjacent to each other in the X-axis direction. Thus, in this embodiment, the gas releasing holes 140 are formed between two pixel electrodes 125 that are adjacent to each other in the Y-axis direction. Therefore, display errors due to the gas releasing holes 140 are less likely to be seen. As illustrated in FIGS. 13 and 14, gas generated from the first planarization film 134 is released to the second planarization film 136 through the light through holes 138C in the reflection electrode 138. As illustrated in FIG. 19, gas generated from the first planarization film 134 and the second planarization film 136 is released to the liquid crystal layer 122 through the second holes 137B and the third holes 135A of the gas releasing holes 140 and via a portion of the second planarization film 136 between every two pixel electrodes 125 that are adjacent to each other in the Y-axis direction. Thus, the gas generated from the first planarization film 134 and the second planarization film 136 can be released.

As previously described, the liquid crystal panel 111 of this embodiment includes the TFTs 124, the pixel electrodes 125 connected to the TFTs 124, the source lines 127 connected to the TFTs 124 and included in the layer lower than the layer including the pixel electrodes 125 and being for transmitting image signals to be supplied to the pixel electrodes 125, the reflection electrode 138 included in the layer upper than the layer including the source lines 127, the common electrode 137 included in the layer lower than the layer including the pixel electrodes 125 and upper than the layer including the source lines 127, the inter-electrode insulating film 135 disposed between the pixel electrodes 125 and the common electrode 137, and the second planarization film 136 (the second insulating film) included in the layer upper than the layer including the source lines 127 and lower than the layer including the common electrode 137. The reflection electrode 138 includes the reflection layer 138B that reflects light and the reflection layer 138B has the uneven surface 138S. The common electrode 137 is disposed to overlap at least the pixel electrodes 125 and the source lines 127 and charged at the common potential. The thickness of the second planarization film 136 is greater than that of the inter-electrode insulating film 135.

With the TFT 124 being driven, the pixel electrode 125 is charged at a potential based on the image signal transmitted via the source line 127. With the pixel electrode 125 being disposed to overlap the common electrode 137 having a common potential via the inter-electrode insulating film 135, a storage capacitance is created between the pixel electrode 125 and the common electrode 137. With using the storage capacitance, the potential of the charged pixel electrode 125 can be appropriately maintained. On the other hand, with the reflection layer 138B of the reflection electrode 138 reflecting light, an image can be displayed with using external light. With the reflection layer 138B of the reflection electrode 138 having the uneven surface 138S, external light is reflected and diffused by the reflection layer 138B and displaying close to paperwhite can be achieved.

The common electrode 137 having a common potential is disposed in the layer upper than the layer including the source lines 127 and lower than the layer including the pixel electrodes 125. With such a configuration, parasitic capacitance is less likely to be created between the source lines 127 and the pixel electrodes 125. Furthermore, the second planarization film 136 that is included in the layer upper than the layer including the source lines 127 and lower than the layer including the common electrode 137 has a thickness greater than the thickness of the inter-electrode insulating film 135. This keeps flatness of the common electrode 137 that is included in the layer upper than the layer including the second planarization film 136. With flatness of the common electrode 137 being kept, flatness of the pixel electrode 125 that is included in the layer upper than the layer including the common electrode 137 via the inter-electrode insulating film 135 can be ensured. Therefore, variation in the distance between the pixel electrodes 125 and the common electrode 137 is less likely to be caused compared to the configuration including the common electrode that overlaps the reflection layer having an uneven surface via an insulating film. With such a configuration, a storage capacitance created between the pixel electrode 125 and the common electrode 137 can be stable and display quality is less likely to be lowered.

The reflection electrode 138 is included in the layer lower than the layer including the second planarization film 136. The first planarization film 134 (the fourth insulating film) is disposed in the layer upper than the layer including the source lines 127 and lower than the layer including the reflection electrode 138. The first planarization film 134 is thicker than the inter-electrode insulating film 135. With the reflection electrode 138 being included in the layer lower than the layer including the second planarization film the uneven 136, surface 138S of the reflection layer 138B of the reflection electrode 138 is planarized by the second planarization film 136. Unlike the configuration including the reflection electrode in the layer upper than the layer including the pixel electrodes 125, the uneven surface 138S of the reflection layer 138B of the reflection layer 138B is not exposed as the most upper layer. With the thickness of the first planarization film 134 that is included in the layer lower than the layer including the reflection electrode 138 being greater than the thickness of the inter-electrode insulating film 135, reproduction of the shape of the uneven surface 138S of the reflection layer 138B of the reflection electrode 138 can be effectively achieved.

The reflection electrode 138 is charged at the common potential. The reflection electrode 138 and the common electrode 137 that are charged at the common potential are included in the layer upper than the layer including the source lines 127 and the lower than the layer including the pixel electrodes 125. Therefore, a parasitic capacitance is less likely to be created between the source lines 127 and the pixel electrodes 125.

The pixel electrodes 125 are arranged at intervals and the reflection electrode 138 extends in areas between the pixel electrodes 125. The reflection electrode 138 is disposed to overlap the pixel electrodes 125 and the area between every two pixel electrodes 125 that are adjacent to each other. With such a configuration, the amount of light rays reflecting off the reflection layer 138B increases compared to the configuration including reflection electrodes each of which overlaps each of the pixel electrodes 125. This preferably improves brightness of display images.

The liquid crystal panel 111 includes the intermediate electrode 41 (the fifth electrode) that is included in the layer lower than the layer including the second planarization film 136 and upper than the first planarization film 134. The reflection electrode 138 includes the transparent electrode layer 138A that is included in the layer lower than the reflection layer 138B. The intermediate electrode 41 is a portion of the transparent electrode layer 138A and disposed to overlap a portion of the TFT 124 and a portion of the pixel electrode 125. The first planarization film 134 includes the first pixel contact hole CH4 (the second contact hole) in a portion overlapping the TFT 124 and the intermediate electrode 41. The intermediate electrode 41 is connected to the TFT 124 via the first pixel contact hole CH4. The second planarization film 136 includes the second pixel contact hole CH5 (the third contact hole) in a portion overlapping the pixel electrode 125 and the intermediate electrode 41. The pixel electrode 125 is connected to the intermediate electrode 41 via the second pixel contact hole CH5. The intermediate electrode 41 is connected to a portion of the TFT 124 via the first pixel contact hole CH4 in the first planarization film 134 and a portion of the pixel electrode 125 is connected to the intermediate electrode 41 via the second pixel contact hole CH5 in the second planarization film 136. The intermediate electrode 41, which is disposed to overlap the pixel electrode 125, is a portion of the transparent electrode layer 138A. Therefore, the intermediate electrode 41 transmits light. The intermediate electrode 41 does not include the reflection layer 138B. Therefore, even if an extra portion of the metal film for the reflection layer 138B remains, short-circuit is less likely to occur between the remaining extra portion of the metal film and the intermediate electrode 41.

The liquid crystal panel 11 includes the opposed electrode 130 (the sixth electrode) and the liquid crystal layer 122. The opposed electrode 130 is disposed opposite and away from the pixel electrodes 125 and has the common potential. The liquid crystal layer 122 is disposed between the pixel electrodes 125 and the opposed electrode 130. An electric field having effective intensity is created between the opposed electrode 130 and the pixel electrode 125 that is connected to the TFT 124 via the intermediate electrode 41. Accordingly, the orientations of the liquid crystal molecules included in the liquid crystal layer 122 are controlled by the electric field that is created between the pixel electrode 125 and the opposed electrode 130. The uneven surface 138S of the reflection layer 138B of the reflection electrode 138 is not exposed as the most upper layer. Therefore, the volume of the liquid crystal layer 122 is less likely to be changed.

Other Embodiments

The technology described herein is not limited to the embodiments described above and illustrated by the drawings. For example, the following embodiments will be included in the technical scope of the present technology.

(1) The planar shape and the planar size of the pixel electrode 25, 125 may be altered as appropriate other than those illustrated in the drawings.

(2) The arrangement, the number, the planar shape, and the planar size of the light through holes 38C, 138C of the reflection electrode 38, 138 may be altered as appropriate other than those illustrated in the drawings.

(3) The arrangement and planar size of the electrode 24A, 24B, 24C, 124C and the semiconductor section 24D of the TFT 24, 124 may be altered as appropriate other than those illustrated in the drawings.

(4) The arrangement, the number, the planar shape, and the planar size of the gas releasing holes 40, 140 may be altered as appropriate other than those illustrated in the drawings. For example, in the configuration of the first embodiment, the gas releasing hole 40 may be formed in a portion overlapping the gate line 26. In the configuration of the second embodiment, all the gas releasing holes 140 may be formed in portions overlapping the gate lines 126 but not overlapping the source lines 127.

(5) The gas releasing holes 40, 140 may not be formed.

(6) The width and the length of the redundant line 39 may be altered as appropriate other than those illustrated in the drawings. For example, the width of the redundant line 39 may be about same as the width of the source line 27, 127.

(7) The redundant lines 39 may not be included.

(8) The liquid crystal panel 11, 111 may be a reflective liquid crystal panel other than the semitransmissive liquid crystal panel. With the liquid crystal panel 11, 111 being a reflective liquid crystal type, the backlight unit may not be included.

(9) With the liquid crystal panel 11, 111 being a reflective liquid crystal panel as described in (8), the reflection electrode 38, 138 may not include the transparent electrode layer 38A, 138A and include only the reflection layer 38B, 138B. With the second embodiment not including the first transparent electrode film a portion of which is configured as the transparent electrode layer 138A, portions of the third metal film may be configured as the intermediate electrode 41.

(10) With the liquid crystal panel 11, 111 being a reflective liquid crystal panel as described in (8), the pixel electrodes 25, 125 and the common electrode 37, 137 may not be portions of the transparent electrode film but may be portions of a metal film.

(11) With the liquid crystal panel 11, 111 being a reflective liquid crystal panel as described in (8), the reflection electrode 38 of the first embodiment may not include the light through holes 38C.

(12) The material of the semiconductor film of the semiconductor section 24D may be amorphous silicon and polysilicon (LTPS).

(13) The opposed substrate 20, 120 may not include the color filters 28 and the liquid crystal panel 11, 111 may be a semitransmissive liquid crystal panel performing black and white displaying. In the opposed substrate 20, 120 including the color filters 28, the kinds and the number of colors of the color filters 28 may be altered.

(14) The color filters 28 may not be included in the opposed substrate 20, 120 but may be included in the array substrate 21, 121.

(15) The display mode of the liquid crystal panel 11, 111 may be the IPS (In-Plane Switching) mode.

The invention claimed is:

1. A display device comprising:

a switching component;

a first electrode connected to the switching component;

a first line connected to the switching component and included in a layer lower than a layer including the first electrode, the first line being for transmitting an image signal to be supplied to the first electrode;

a second electrode included in a layer upper than the layer including the first line, the second electrode including a reflection layer that reflects light and has an uneven surface;

a third electrode included in a layer lower than the layer including the first electrode and upper than the layer including the first line, the third electrode being disposed to overlap at least the first electrode and the first line and having a common potential;

a first insulating film disposed between the first electrode and the third electrode; and a second insulating film included in a layer upper than the layer including the first line and lower than the layer including the third electrode, the second insulating film having a thickness greater than a thickness of the first insulating film.

2. The display device according to claim 1, further comprising a third insulating film disposed between the second electrode and the first electrode and having a thickness greater than the thickness of the first insulating film, wherein the second electrode is included in a layer upper than the layer including the first electrode.

3. The display device according to claim 2, further comprising:

a fourth electrode disposed opposite and away from the second electrode and having the common potential; and a liquid crystal layer disposed between the second electrode and the fourth electrode and disposed to overlap the first electrode, wherein the third insulating film includes a first contact hole in a portion overlapping the second electrode and the first electrode, and the second electrode is connected to the first electrode via the first contact hole.

4. The display device according to claim 1, further comprising a fourth insulating film included in a layer upper than the layer including the first line and lower than the layer including the second electrode and having a thickness greater than the thickness of the first insulating film, wherein the second electrode is included in a layer lower than the layer including the second insulating film.

5. The display device according to claim 4, wherein the second electrode has the common potential.

6. The display device according to claim 5, wherein the first electrode includes first electrodes that are arranged at intervals, and the second electrode is disposed in an area extending over the first electrodes.

7. The display device according to claim 4, further comprising a fifth electrode included in a layer lower than the layer including the second insulating film and upper than the layer including the fourth insulating film, wherein the second electrode is a portion of a transparent electrode film that is included in a layer lower than the layer including the reflection layer, the fifth electrode is a portion of the transparent electrode film and disposed to overlap a portion of the switching component and a portion of the first electrode, the fourth insulating film includes a second contact hole in a portion overlapping the switching component and the fifth electrode, the fifth electrode is connected to the switching component via the second contact hole, the second insulating film includes a third contact hole in a portion overlapping the first electrode and the fifth electrode, and the first electrode is connected to the fifth electrode via the third contact hole.

8. The display device according to claim 7 further comprising:

a sixth electrode disposed opposite and away from the first electrode and having the common potential; and a liquid crystal layer disposed between the first electrode and the sixth electrode.

9. The display device according to claim 1 further comprising:

a second line connected to the switching component and crossing the first line and being for transmitting scan signals;

a fifth insulating film included in a layer lower than the layer including the first line and upper than the layer including the second line; and a third line included in a layer lower than the layer including the fifth insulating film and disposed to overlap the first line, wherein the fifth insulating film includes a fourth contact hole in a portion overlapping the first line and the third line, and the first line is connected to the third line via the fourth contact hole.

* * * * *